(12) United States Patent
Johnson et al.

(10) Patent No.: US 9,800,862 B2
(45) Date of Patent: Oct. 24, 2017

(54) SYSTEM AND METHODS FOR VISUALIZING INFORMATION

(71) Applicant: The Board of Trustees of The University Of Illinois, Urbana, IL (US)

(72) Inventors: Andrew Johnson, Forest Park, IL (US); Maxine Brown, Chicago, IL (US); Jason Leigh, Beverly, IL (US); Thomas Peterka, Hillside, IL (US); Jonas Talandis, River Forest, IL (US); Lance Long, Elgin, IL (US); Luc Renambot, Chicago, IL (US); Daniel J. Sandin, Chicago, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 130 days.

(21) Appl. No.: 13/916,555

(22) Filed: Jun. 12, 2013

(65) Prior Publication Data
US 2013/0328777 A1 Dec. 12, 2013

Related U.S. Application Data

(60) Provisional application No. 61/658,759, filed on Jun. 12, 2012.

(51) Int. Cl.
| | |
|---|---|
| G06F 3/033 | (2013.01) |
| G09G 5/08 | (2006.01) |
| H04N 13/04 | (2006.01) |
| H01L 27/32 | (2006.01) |
| G02F 1/1333 | (2006.01) |
| G06F 1/16 | (2006.01) |
| G06F 3/14 | (2006.01) |
| G09F 9/302 | (2006.01) |

(52) U.S. Cl.
CPC ..... *H04N 13/0452* (2013.01); *H04N 13/0456* (2013.01); *G02F 1/13336* (2013.01); *G06F 1/1647* (2013.01); *G06F 3/1423* (2013.01); *G06F 3/1446* (2013.01); *G09F 9/3026* (2013.01); *G09G 2300/02* (2013.01); *G09G 2300/023* (2013.01); *G09G 2300/026* (2013.01); *H01L 27/3293* (2013.01)

(58) Field of Classification Search
CPC ....... G09G 2300/026; G09G 2300/023; G09G 2300/02; H04N 13/0456; H04N 13/0452; H04N 2213/006; H04N 13/0409; H04N 2213/001; G06F 3/1446; G06F 3/1423; G06F 1/1647; G02F 1/13336; G09F 9/3026; H01L 27/3293
USPC .................................................. 345/1.1, 1.3
See application file for complete search history.

(56) References Cited

U.S. PATENT DOCUMENTS

| | | |
|---|---|---|
| 5,844,717 A | 12/1998 | Faris |
| 5,945,986 A | 8/1999 | Bargar et al. |
| 6,009,394 A | 12/1999 | Bargar et al. |

(Continued)

*Primary Examiner* — Michael J Jansen, II
(74) *Attorney, Agent, or Firm* — Gamburd Law Group LLC

(57) ABSTRACT

A system and methods for visualizing information on a generally large scale. Certain embodiments include display elements that include a minimized border margin, 2D/3D dual functionality, and ultra-high resolution. The display elements may be positioned relative to an infrastructure element configured to permit generating a wide variety of display geometries.

19 Claims, 19 Drawing Sheets

(56) References Cited

U.S. PATENT DOCUMENTS

| | | | |
|---|---|---|---|
| 6,046,849 A * | 4/2000 | Moseley | G02B 5/3016 348/57 |
| 6,154,723 A | 11/2000 | Cox et al. | |
| 6,690,337 B1 * | 2/2004 | Mayer, III | G06F 1/1601 345/1.1 |
| 7,058,252 B2 * | 6/2006 | Woodgate | G02B 27/2214 348/E13.029 |
| 7,250,710 B2 * | 7/2007 | Gilmour | G02F 1/133603 313/112 |
| 7,589,810 B2 * | 9/2009 | Sugiyama | G02B 27/2214 349/117 |
| 7,812,815 B2 | 10/2010 | Banerjee et al. | |
| 8,040,310 B2 * | 10/2011 | Hada | G09G 3/003 345/87 |
| 8,269,691 B2 * | 9/2012 | Watson | G06F 3/1446 345/1.1 |
| 8,730,224 B2 * | 5/2014 | Lee | G02B 27/26 345/211 |
| 8,760,505 B2 * | 6/2014 | Baik | G09G 3/003 345/32 |
| 8,885,029 B2 * | 11/2014 | Baek et al. | 348/51 |
| 8,928,732 B2 * | 1/2015 | Cho | G02B 27/26 345/419 |
| 8,934,002 B2 * | 1/2015 | Ham | G02B 27/0093 348/42 |
| 8,952,942 B2 * | 2/2015 | Chae | H04N 13/0434 345/204 |
| 9,013,388 B2 * | 4/2015 | Katsuta | G09G 3/003 345/87 |
| 9,076,360 B2 * | 7/2015 | Kim | G09G 3/003 |
| 9,158,164 B2 * | 10/2015 | Tseng | G02F 1/134336 |
| 9,190,001 B2 * | 11/2015 | Kamada | G09G 3/3648 |
| 9,236,023 B2 * | 1/2016 | Katsuta | G09G 3/3648 |
| 2003/0137626 A1 * | 7/2003 | Khazova | G02B 27/285 349/117 |
| 2005/0212744 A1 * | 9/2005 | Hada | G09G 3/003 345/96 |
| 2008/0055105 A1 * | 3/2008 | Blum et al. | 340/815.4 |
| 2008/0170183 A1 * | 7/2008 | Sugiyama | G02B 27/2214 349/96 |
| 2008/0204872 A1 * | 8/2008 | Ijzerman | H04N 13/0404 359/463 |
| 2009/0278826 A1 * | 11/2009 | Murphy | G09F 9/33 345/204 |
| 2010/0238097 A1 * | 9/2010 | Baik et al. | 345/87 |
| 2010/0289884 A1 * | 11/2010 | Kang | G02B 27/2228 348/58 |
| 2010/0328221 A1 * | 12/2010 | Happonen | B60K 35/00 345/173 |
| 2011/0063533 A1 * | 3/2011 | Kim | H04N 13/0456 349/15 |
| 2011/0122239 A1 * | 5/2011 | Baik | G09G 3/003 348/58 |
| 2011/0128269 A1 * | 6/2011 | Lee | G02B 27/26 345/211 |
| 2011/0157167 A1 * | 6/2011 | Bennett | G06F 3/14 345/419 |
| 2011/0157327 A1 * | 6/2011 | Seshadri | G06F 3/14 348/51 |
| 2011/0159929 A1 * | 6/2011 | Karaoguz | H04N 13/0404 455/566 |
| 2011/0164188 A1 * | 7/2011 | Karaoguz et al. | 348/734 |
| 2011/0169919 A1 * | 7/2011 | Karaoguz | H04N 13/0029 348/46 |
| 2011/0211041 A1 * | 9/2011 | Maeda | H04N 13/0454 348/43 |
| 2011/0216177 A1 * | 9/2011 | Chae | H04N 13/04 348/57 |
| 2011/0304616 A1 * | 12/2011 | Ham | G02B 27/0093 345/419 |
| 2012/0002279 A1 * | 1/2012 | Jain | G02B 27/286 359/465 |
| 2012/0007858 A1 * | 1/2012 | Baek | G02B 27/26 345/419 |
| 2012/0008203 A1 * | 1/2012 | Ijzerman et al. | 359/465 |
| 2012/0013656 A1 * | 1/2012 | Chae | H04N 13/0434 345/694 |
| 2012/0056879 A1 * | 3/2012 | Song | H04N 13/0404 345/419 |
| 2012/0075166 A1 * | 3/2012 | Marti et al. | 345/1.1 |
| 2012/0127067 A1 * | 5/2012 | Tseng | G02F 1/134336 345/87 |
| 2012/0140052 A1 * | 6/2012 | Baek et al. | 348/58 |
| 2012/0147161 A1 * | 6/2012 | Kim | H04N 13/0422 348/58 |
| 2012/0154392 A1 * | 6/2012 | Kim | G02B 26/06 345/419 |
| 2012/0223885 A1 | 9/2012 | Perez | |
| 2012/0242797 A1 * | 9/2012 | Watanabe | H04N 13/0438 348/46 |
| 2012/0320037 A1 * | 12/2012 | Aso | H04N 13/0404 345/419 |
| 2012/0326590 A1 * | 12/2012 | Park | G02B 27/26 313/112 |
| 2013/0050117 A1 * | 2/2013 | Cho | G06F 3/0488 345/173 |
| 2013/0070004 A1 * | 3/2013 | Inoue | G09G 3/003 345/690 |
| 2013/0176198 A1 * | 7/2013 | Katsuta | G09G 3/003 345/87 |
| 2013/0181980 A1 * | 7/2013 | Mizutani | G06T 15/00 345/419 |
| 2013/0181985 A1 * | 7/2013 | Katsuta | G09G 3/3648 345/419 |
| 2013/0241905 A1 * | 9/2013 | Kim | G09G 3/003 345/204 |
| 2014/0118340 A1 * | 5/2014 | Huang | H04N 13/0029 345/419 |

* cited by examiner

SYSTEM AND METHODS FOR VISUALIZING INFORMATION

CROSS REFERENCE TO RELATED APPLICATIONS

This application claims the benefit of U.S. provisional application No. 61/658,759 filed Jun. 12, 2012, which is incorporated by reference herein in its entirety.

STATEMENT CONCERNING FEDERALLY SPONSORED RESEARCH

This invention was made with government support under NSF CNS-0959053 awarded by the National Science Foundation. The government has certain rights in the invention.

FIELD OF THE INVENTION

The present invention generally relates to an improved system and methods for visualizing information.

BACKGROUND OF THE INVENTION

Visualization is often an effective means for viewers to gain insight into a research subject. Nearly one-third of the human brain is devoted to processing visual information. Viewing a subject in a variety of perspectives or dimensions may permit a viewer to understand certain details about a subject that would not be evident from other means of providing information about the subject. In addition, without viewing the subject, ascertaining information about the subject may take considerable time. Visualization also may permit enhanced communication about a research subject and may permit improved interpretation of a research subject by expert and lay viewers.

Accordingly, certain devices have been developed for viewing a research subject. However, certain limitations are associated with each of these conventional devices for permitting visualization of information.

For example, certain known devices—microscopes—permit the viewing of a relatively small research subject. However, such devices typically are configured to permit only one person or possibly two people to view the subject at a time. Also, although the research subject may be magnified to a certain degree, the full context of the details of the research subject may not be presented to the viewer.

Certain known devices are intended to permit a viewer to visualize a somewhat larger image of a research subject. Such devices often include projectors to project, or "throw" an image onto a wall. While projectors, such as cathode ray tube projectors, are capable of providing relatively large sized images, such images often have low resolution. One projector is known to provide up to eight megapixels of display resolution. Also, some projectors require maintenance such as geometry and color calibration when the bulbs are changed and can be used only to project two-dimensional images. In addition, certain projectors require a long throw distance, such that the projector must be positioned a certain distance from the surface on which it will project. Such projectors often require that no object or viewer is positioned between the projector and the surface on which it will project. With respect to such devices, the viewer or viewers cannot position themselves close to or adjacent to the screen to examine detail of the image since such positioning will block the projected image from reaching the screen.

Other conventional devices may include two projectors to project a three-dimensional image. Such a three dimensional image—termed a "stereoscopic image"—relies on the creation of an illusion based on the effect of binocular vision. Stereoscopic images may be created by projecting a first perspective of a two-dimensional image to the left eye and a second perspective of the two-dimensional image to the right to the right eye of the viewer. Typically, the viewer's brain processes these images such that the viewer perceives a three-dimensional image. Viewing certain stereoscopic images result in eyestrain or distortion of the image. Certain eyewear seek to decrease, but typically do not eliminate such effects. In addition, using two projectors to create a single stereoscopic image often limits the size and scope of the image.

Devices have been developed that use four projectors to project or rear-project images on four walls, including three side walls and a floor wall. Such devices may permit the viewer to perceive three-dimensional images in four directions—e.g., forward, left, right, and downward. However, such devices typically are expensive, require high degree of maintenance, require a considerable amount of space for the projectors, and need at least four unobstructed walls. Overall, these projector-based devices are limited by the resolution, brightness, and contrast capabilities of each projector.

To avoid certain disadvantages associated with projector-based devices, equipment has been developed that use liquid crystal display or "LCD" panels to permit display of an image. In certain devices, multiple LCD panels are positioned adjacent to one another to form a single image as viewed on the collection of panels. When these multiple LCD panels are placed adjacent to one another, the panels often include a large border margin such that the screen portion of each panel is disrupted and generally non-continuous.

Also, certain LCD panels used in known devices utilize a 3D creation layer configured to create a 3D effect. Examples of a 3D creation layer include a micropolarization layer or a patterned-retarder barrier. In certain embodiments, a patterned-retarder barrier may be aligned directly with the pixels of the screen. Such a configuration often establishes a "ghosting" effect to be produced when the viewer is positioned relative to the LCD in certain positions—e.g., vertically off-axis from the center. "Ghosting" occurs because the viewer perceives an object displayed via the LCD with a replica of the transmitted object, offset in position, super-imposed on top of the intended object. The "ghosting" effect may be caused by an image intended for one eye leaking through to an image intended for the other eye. Clearly, such "ghosting" effect is distracting, disrupts the viewer's experience, and makes it more difficult to perceive specific details about the research subject.

Other known LCD devices alternate display of left and right eye images, which is called field-sequential stereo. These devices typically do not suffer from off-axis ghosting but require electronics to be imbedded in the glasses to synchronize with the switching of the images on the monitor. Furthermore in a tiled configuration, these panels must be perfectly synchronized with each other to function properly.

Certain other devices use LCD panels to generate what is called an autostereoscopic display in which the viewer does not need eyewear to perceive the three-dimensional image. Certain LCD panel permit display of only two-dimensional images (monoscopic display), and certain LCD panel permit display of both three-dimensional images and two-dimensional images (stereoscopic display) in the same panel. Devices configured to permit two-dimensional viewing may provide tens to hundreds of megapixels of resolution. However, the devices configured to permit two-dimensional and three-dimensional display are typically around 2 megapixels. Such a low display resolution does not permit viewing of certain details of an image, decreases the viewer experience, and reduces the ease with which multiple viewers may perceive the image.

Accordingly, there is a demand for a system and methods for visualizing information capable of simultaneously generating a stereoscopic display and a monoscopic display in the same display panel at an ultra-high resolution. The present invention satisfies this demand.

SUMMARY OF THE INVENTION

Certain embodiments of the present invention are configured to permit the visualization of information. Although the present invention is discussed largely in reference to visualizing information directed to one or more research subjects, the discussion is merely exemplary. The present invention is applicable to visualizing any type of information and content and may be used for many purposes including educational, medical, scientific, financial, and entertainment purposes.

For purposes of this application, a "research subject" or a "subject" generally may include a physical item, a non-physical element, a collection of physical items, a collection of non-physical elements, or a collection including physical items and non-physical elements. A physical item may include any item with a tangible component, including biological items such as healthy or pathological cells, tissues, organs, organisms, or microorganisms, land and geological features, astronomy items, extragalatic data items, atmospheric items, meteorological items, environmental items, architectural items, computer science hardware items, detailed reconstruction of art exhibits, to name a few.

A non-physical element of a research subject includes observations about physical items, principles related to physical items, statistics, formulas, and other data that are not tangible or are only tangible for a transitory period of time. Examples of non-physical elements include observations about behavior, group dynamics, comparison of computer interfaces targeted to different users, large-scale computations, evaluations of advanced data access techniques for real-time large-scale data visualization applications, size constancy in a virtual environment, interplay of multiple interaction tools in large-scale visual immersive environments, psychophysics of visual perception, visual motor coordination, and combining robots and virtual reality for rehabilitation, protocol for stroke patients in which an actuated glove orthosis is used to create hand rehabilitation therapy, computer-generated stereoscopy using micropolarizing arrays specifically targeting algorithms for interleaving the view channels displayed on a panel, thermonuclear mechanism in Type IA supernovae, flow of fluids, strength of polymers, efficiency of catalysts, evaluation of pollution and ground water contamination, and urban traffic simulations, to name a few.

Certain embodiments of the present invention may be configured to permit visualization of research information in the form of an image, a video, a live-feed, a graph, a chart, an illustration, or another representation of information. For purposes of this application, the term "representation" means a depiction of any research subject. Certain representations may be configured or adapted specifically for display by the system of the present invention. Other representations may be general representations viewable in many ways, but also capable of being viewed using the system and methods of the present invention.

The system and methods of the present invention may include a number of elements. For example, one preferred embodiment includes a visualization element and an infrastructure element. Other embodiments may optionally include an audio element, user input element, controller element, and data storage element.

Examples of a visualization element include a liquid crystal display with 2-dimensional (2D) display capability, a light emitting diode monitor with 2D display capability, a liquid crystal display with 3-dimensional (3D) display capability, a light emitting diode monitor with 3D display capability, a light emitting diode monitor with 2D/3D dual display capability, and a liquid crystal display with 2D and 3D dual display capability, the last of which is also termed a hybrid viewing experience for the user.

A visualization element that includes both 2D and 3D capability is improved over known combination 2D and 3D devices by decreasing the "ghosting" effect. More specifically, a visualization element may include a first layer of pixels. Each pixel includes an inner segment defined by an outer border. The outer border may take any shape, but in certain embodiments, includes a polygon that has at least two generally parallel border edges. Another layer of the visualization element may include a patterned-retarded barrier which has alternating lines of polarization. More specifically, a first line of polarization may be negative, the directly adjacent line of polarization is positive, the next directly adjacent line of polarization is negative, and so on, continuing to alternate polarity with each line of polarization. The patterned-retarder barrier may be positioned directly or indirectly adjacent to the layer of pixels such that the inner segment of each pixel is in contact with a portion of only one line of positive polarization and only one line of negative polarization. Such placement of the patterned retarded barrier is considered "shifted" relative to an alternate configuration in which each line of polarization is generally aligned with each pixel such that the inner segment of each pixel is generally in contact with only one type of polarization line.

Advantageously, the visualization elements may be configured to provide 2D-3D dual functionality at an ultra-high resolution. Examples of ultra-high resolution levels include 1366×768 pixels and 1920×1080 pixels. Visualization elements also may include 4K screens. The embodiments of a visualization element includes one or more dual function, high resolution liquid crystal display monitors, which will be termed a "display element" for purposes of this application. Certain embodiments are configured to provide a resolution matching or surpassing human visual acuity of 20/20. The massive resolution afforded by display elements of the present system enables users to view and juxtapose large collections of high-resolution visualizations generated in real-time from computer clusters housed at supercomputing facilities around the world.

Certain embodiments of the present invention include one or more display elements. The one or more display elements may be configured to include a minimized border margin such that when multiple monitors are positioned directly side-by-side or directly top-to-bottom, the gap between the respective screens is minimized. In certain embodiments, the gap between the respective screens may be as little as 5 mm to 7 mm. Certain embodiments of the present invention are configured to permit positioning of two or more monitors such that the screen portion of the monitors form an almost seamless, almost completely continuous compound display component.

Embodiments that include a compound display component having two or more display elements also may include an infrastructure element. An infrastructure element is configured to permit arranging or positioning the two or more display elements in a display geometry. Advantageously, when multiple small or medium sized display elements are positioned relative to the infrastructure, the border of each display element acts a joint such that many display geometries are possible. Examples of a display geometry include a table configuration, a chair configuration, a wall configuration, a floor configuration, ladder configuration, or other configuration. An infrastructure element may include generally vertical support elements, generally horizontal support elements, generally linear support elements, and generally round support elements, any of which may be connected or positioned relative to one another to form a frame. One such frame is termed a truss structure. Another frame includes a truss structure and a removable hanging display unit. A removable hanging display unit is configured to be attachable to one or more display elements and connectable, and also removable from the truss structure such that the one or more display elements may be easily positioned and re-positioned relative to the truss structure. Attachment elements may be configured to removably or fixedly attach the display elements to components of the frame. Examples of attachment elements include hangars, hooks, hook and loop elements, male and female elements, adhesive, nut and bolts, and clamps, to name a few.

Certain embodiments of the present invention are configured to improve the viewer perspective perceived via the compound display component. For example, in certain embodiments, the system is configured to utilize a single-viewer-centered-perspective. In such embodiments, that which is the focal point of the research subject on display is featured in the display element which the user is facing. In such embodiments, the system may be configured such that the user is always or generally facing a specific direction. For example, the system may include a user input component such as a stationary chair or other stationary device configured to support a user. Clearly, such a stationary chair may facilitate the user facing a specific direction and, accordingly, the system may always feature the focal point of that which is being displayed in the display element in the user's predicted line of sight. In other embodiments, the system includes a user input component configured to detect the direction that the user is facing in order to analyze which display element will display the focal point of the research subject in the representation.

In still additional embodiments, the system is configured to display not only a single-viewer-centered-perspective, but also, a panoptic-stereoscopic-perspective, wherein the images displayed as if the user was facing every display element simultaneously. Advantageously, such embodiments facilitate use of the system by multiple users simultaneously. In addition, such embodiments facilitate improved user experience of the system even for single users that use the system at different times because, for example, each user may be a different height (and therefore naturally focus on different portions of the display element than someone of a different height).

Because traditional virtual reality environments use viewer-centered perspective, one effect that typically occurs is that when the tracked user looks 180 degrees away from a given stereo screen, the stereo reverses. While this is acceptable for a single user, given they are no longer looking at the screen, it poses a problem for other audience members. To solve this issue, certain embodiments of the present invention support panoptic stereo. Techniques similar to Panoptic stereo have been implemented in the past to support multi-user stereo without generating multiple views. When Panoptic stereo is enabled, the system tracks the main viewer's position in the system, but generates head orientation information based on each display plane normal. This way, the stereo frustum is projected outward to each display panel, preserving stereo separation for each user in the system. An additional benefit of panoptic stereo is its independence from frame latency: when users move their head around, stereo will look correct regardless of the application frame rate, leading to a much more comfortable viewing experience.

While preferred embodiments of the present invention do not require a projector, certain embodiments of the present invention incorporate not only a display element, but also a projector configured to augment the representation provided by the display element.

Some preferred embodiments of the present invention include an audio element. Examples of an audio element may include one or more speakers, multichannel immersive audio controller, digital to analog converter, and analog to digital converter. Certain embodiments of the present invention utilize audio software that permits users of the system and methods to create aural experiences that exceed limitations set by typical proprietary audio software/hardware (e.g. Dolby 5.1 or 7.1 surround sound). For example, an Application Programming Interface may provide applications with the ability to link 3D visual objects with audio samples, and accordingly, create object-oriented sound, that will be synthesized by the multichannel immersive audio controller. The speakers of the system may be arranged, for example, in a contiguous ring, semi-circle, or other pattern, positioned relative to each display element, or positioned relative to the user's anticipated position (e.g., to create surround sound or semi-surround sound). Each speaker may be positioned on the floor, in the ceiling, suspended from the display elements, enclosed within a display housing that also houses the display elements, or any other configuration. The multichannel immersive audio controller is configured to receive audio control signals from a master management element which assesses and controls where one or more audio sound samples or real-time algorithmic audio should be played in 3D space, as well as information on aural characteristics—such as loudness, pitch, reverb, echo, etc. that are algorithmically generated. To control the audio playback of each speaker to produce the spatialized audio effect, the management element algorithm must take into account two factors: (1) position of the user within the physical space relative to the display elements and other system components, and (2) position of the display elements and other system component in the virtual space. Both factors may dynamically change in real-time and therefore the control of the speakers must be computed in real-time as well. In contrast, most movie theaters and video game experiences incorporate only factor (2).

The resulting synthesized audio from the multichannel immersive audio controller is directed to the digital-to-analog converter which converts the digital signals into analog signals that drive the appropriate speakers to position correctly the audio in 3D space.

Additional embodiments of an audio element may include a general microphone or an echo-cancelling microphone positioned relative to the display element(s) for use in voice-command or video conferencing embodiments. An audio element also may include an acoustic dampening component to reduce audio reflection from display surfaces.

For purposes of this application, the term "production output" will be used to refer to any combination of that which is displayed in the one or more display elements and the audio emitted from any speakers.

Certain preferred embodiments of the present invention also include a user input element. Examples of a user input element include a keyboard, touch screen, joystick, trackball, mouse, microphone, camera, wand, six-degree of freedom unit, sphere navigation unit, gaming controller, wheel component, a speech recognition component, gesture recognition receiver, wearable input device such as Google Glass™, Microsoft Kinect™, other computer peripheral device, mobile computer system such as a tablet (e.g., iPad™) or smartphone (e.g., iPhone™), or component configured to permit input of data by the user.

Certain embodiments of a six-degrees of freedom unit are configured as a 3D pointer in a virtual environment.

Certain embodiments of a navigation unit, such as a sphere navigation unit, include a six-degrees of freedom unit that is partially or completely encased in a housing. By turning and re-orienting the navigation unit, the representation of the virtual object will rotate accordingly in the display element. In other words, by moving the navigation unit, the virtual object will move. The optional camera and microphone positioned inside or outside the housing may be used as auxiliary user sensors for examining how users are holding the sphere as well as sensing tapping of the housing, potentially for issuing commands to the system. The navigation unit also may include an accelerometer or a motor for causing vibration or other movement of the navigation unit. While the housing may have a sphere shape, it also may take other shapes suitable for user comfort and utilization.

The navigation unit housing may include a touchscreen, other tactile sensors or orientation sensors positioned, not only within the housing, but also on the outer surface. The navigation unit may be configured to permit a user to manipulate a virtual object using the navigation unit as a physical surrogate. Certain embodiments of a navigation unit may have a customizable housing such that the navigation unit may be sized or shaped to more closely substitute for a physical object. Advantageously, the navigation unit permits tactile interaction with the research subject, thereby facilitating tactile learning.

In certain embodiments, the navigation unit may be configured for use with an activator element configured to communicate certain information with the navigation unit. An entire activator element may be wearable or may be associated with a wearable item, such as a glove, a finger cover, a thimble, a body suit, a shirt, a sock, earbud, headset, headband, glasses, earrings, necklace, or bracelet. An example of an activator element is a touchscreen-compatible glove wherein at least part of the pointer finger and/or thumb are made from conductive thread configured to activate a touchscreen. An example of a non-wearable activator element is a stylus.

A characteristic of certain virtual environments is real-time interaction between the user and the virtual world. Certain embodiments may include a position sensing system, such as a head tracker, and a navigation unit, such as a wand. Both the system head sensor and wand may be tracked using a six-degrees of freedom (position and orientation) unit. The wand may include have buttons and a joystick to assist in navigational tasks. A tetherless, infrared camera-based system from may be included in the head and wand interaction.

Certain embodiments of the present invention also may include user sensors configured to detect the user position information, e.g., the position or orientation of the user relative to the other system elements. For example, ART-track2 cameras may be used to track the user space in preferred embodiments. Electromagnetic trackers, acoustic-inertial tracking may be used in alternative embodiments. The system may be configured to permit a user to maximize use of the system when the user is positioned within an intended viewing perimeter. The system also may cease operation when the user is outside of the system range perimeter, outside of which certain wireless communication between system components may cease or the system may automatically shut down upon detecting that the user is at a certain distance.

Certain preferred embodiments of the invention also include a management element configured to manage the other elements in the system. A management component may include one or more computer systems or cloud computing system. The management component may be configured to receive, store, generate, or amend representations for viewing in the compound display component or display element. A single computer system may control one or more display elements or each display element may be controlled by, and possibly physically connected to, its own computer system. In embodiments in which multiple computer systems are present, one computer system is configured to have authorization to coordinate the actions of each display element such that the group of display elements that form a particular environment may be synchronized.

Certain preferred embodiments of the present invention include a storage element configured to permit storing data accessible by the computer system, cloud computing system, or other system elements. Examples of a storage element include a main memory and a secondary memory, each of which may be internal or external to a computer system.

An objective of the present invention is that certain embodiments permit an ultra-high display resolution.

Another objective of the present invention is that certain embodiments permit a display resolution that is 30 times higher than the display resolution permitted by certain projector-based devices.

Another objective of the present invention is that certain embodiments can be used to create two-dimensional images and three-dimensional stereoscopic images.

Another objective of the present invention is that certain embodiments can be used to create two-dimensional images and three-dimensional images simultaneously in the same display element.

Another objective of the present invention is that certain embodiments can be used to create a sense of immersion in the representation for the viewer.

Another objective of the present invention is that certain embodiments can be used to create a sense of presence and participation in that which is displayed on the display elements for the viewer.

Another objective of the present invention is that certain embodiments can be used to provide high acuity, that is—fidelity of displayed information, and a combination of high resolution, brightness, and contrast.

Another objective of the present invention is that certain embodiments have a low financial cost, and therefore, are accessible to more entities and more people.

Another objective of the present invention is that certain embodiments are sized and shaped to minimize the space used by each component, and therefore, requires less space to operate or store.

Another objective of the present invention is that the display components appear generally seamless—i.e. do not include thick borders.

Another objective of the present invention is that certain embodiments facilitate generally unencumbered stereoscopic viewing of an image.

Another objective of the present invention is that certain embodiments permit multiple viewers to perceive stereoscopic images at the same time.

Another objective of the present invention is that certain embodiments include intuitive user interfaces for controlling the image.

Another objective of the present invention is that certain embodiments permit nearly seamless scaling of the image to achieve higher resolution displays.

Another objective of the present invention is that certain embodiments permit display of an image, a video, a live-feed, a display, an illustration, a chart, a graph, or another representation of a research subject.

Another objective of the present invention is that certain embodiments permit simultaneous visualization of multiple images, videos, live-feeds, displays, illustrations, charts, graphs, or other representations of a research subject.

Another objective of the present invention is that certain embodiments permit simultaneous visualization of large quantities of information.

Another objective of the present invention is that certain embodiments are configured to store large data files, including data files sized as large as gigabytes to terabytes.

Another objective of the present invention is that the components of certain embodiments require little maintenance.

An additional objective of the present invention is that certain embodiments permit multi-gigabit network connectivity.

An additional objective of the present invention is that certain embodiments permit improved coupling of worldwide organizations.

An additional objective of the present invention is that certain embodiments permit improved integration of scientific workplaces with globally distributed cyber-infrastructure.

The present invention and its attributes and advantages will be further understood and appreciated with reference to the detailed description below of presently contemplated embodiments, taken in conjunction with the accompanying drawings.

BRIEF DESCRIPTION OF THE DRAWINGS

The preferred embodiments of the invention will be described in conjunction with the appended drawings provided to illustrate and not to the limit the invention, where like designations denote like elements, and in which.

DETAILED DESCRIPTION OF EMBODIMENTS OF THE INVENTION

Figure 1A:
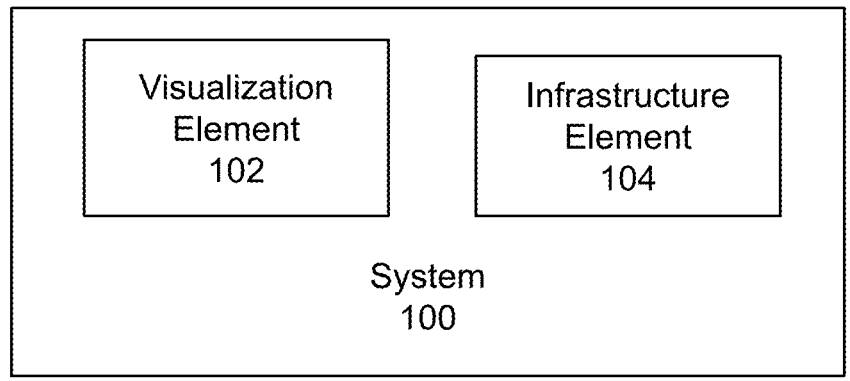
FIG. 1A illustrates a system embodiment of the present invention.
Figure 1B:
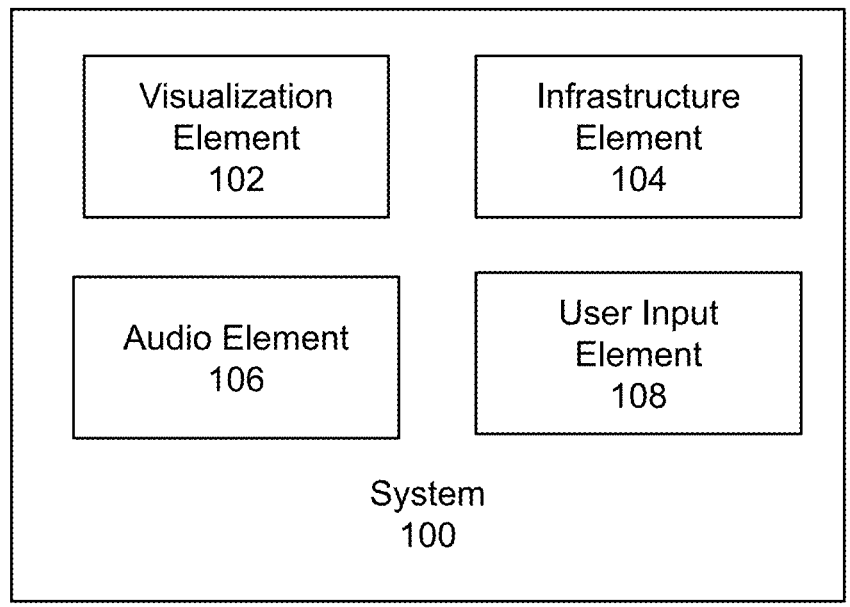
FIG. 1B illustrates a system embodiment of the present invention.
Figure 1C:
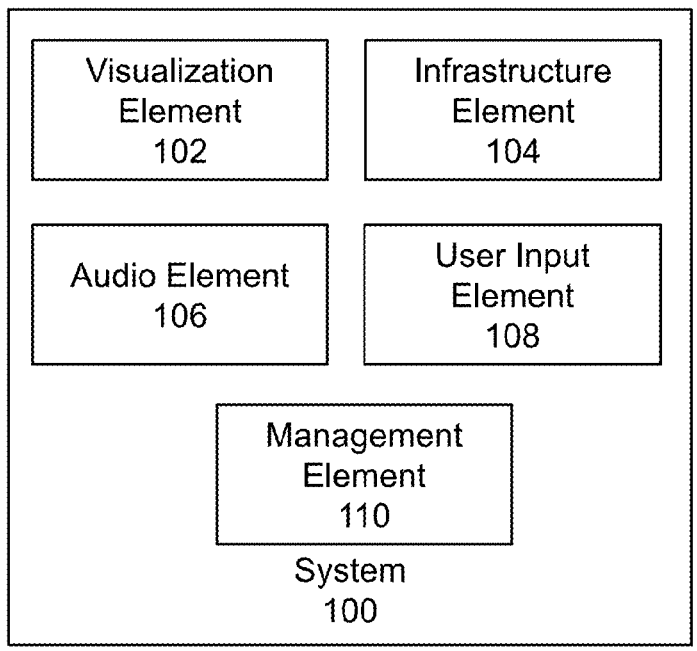
FIG. 1C illustrates a system embodiment of the present invention.
Figure 1D:
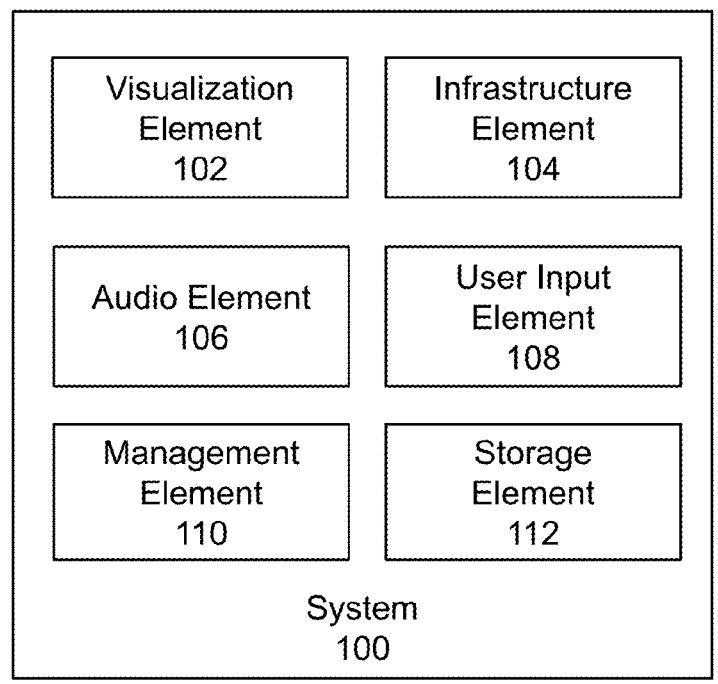
FIG. 1D illustrates a system embodiment of the present invention.

Certain embodiments of a system 100 of the present invention include a visualization element 102 alone or a visualization element 102 and an infrastructure element 104 as illustrated in FIG. 1A. Additional elements that may be included in certain embodiments of the system 100 include an audio element 106, user input element 108, management element 110, and storage element 112. Embodiments having certain combinations of elements are illustrated in FIGS. 1A-1D, but the illustrated combinations of elements are not limiting.

Figure 2:
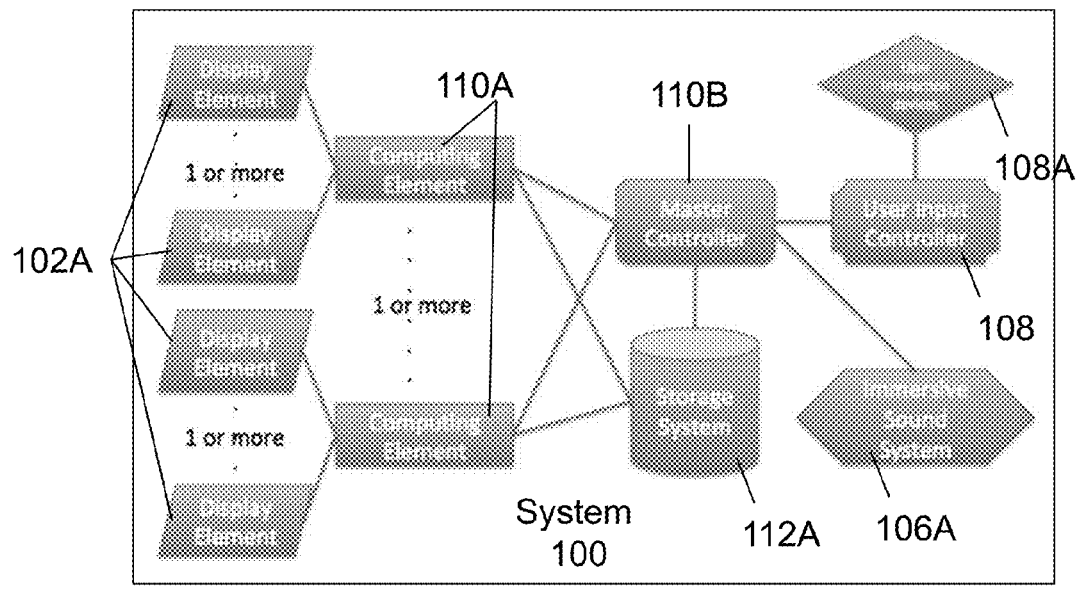
FIG. 2 illustrates a system embodiment of the present invention.

FIG. 2 illustrates another embodiment of the system 100 of the present invention. The illustrated embodiment includes a visualization element 102 configured as a display element 102A. In addition, a management element 110 is configured as a computing element 110A and a second management element configured as a master controller 110B. The storage element 112 is configured as a storage system 112. The audio element 106 is configured as an immersive sound system 106A.

Figure 3:
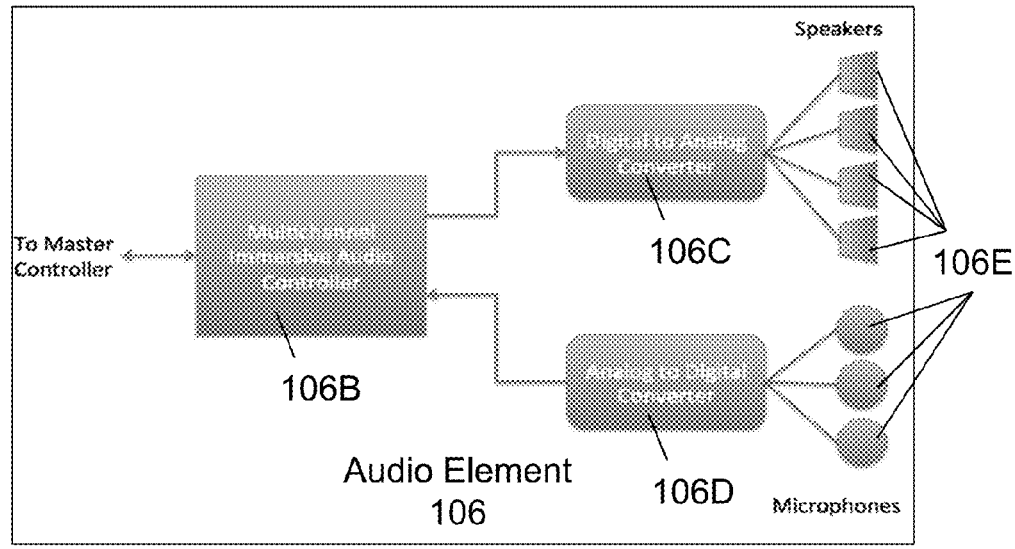
FIG. 3 illustrates an embodiment of an audio element according to the present invention.

FIG. 3 illustrates an embodiment of an audio system 106. The audio system 106 may receive information from a management element 110. A multichannel immersive audio controller 106B may control the instructions sent to each of the one or more speakers 106E in the system. A digital to analog converter 106C and analog to digital converter 106D may translate the communications between the multichannel immersive audio controller 106B and the respective speakers 106E.

Figure 4A:
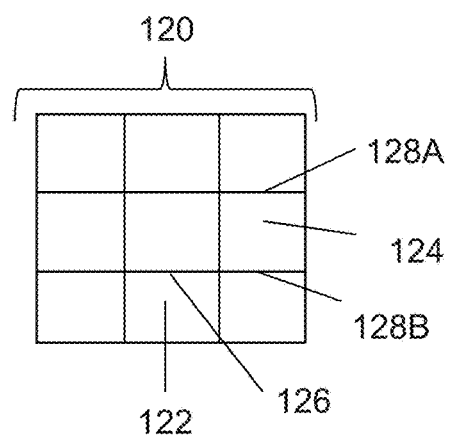
FIG. 4A illustrates an embodiment of a layer of pixels.
Figure 4B:
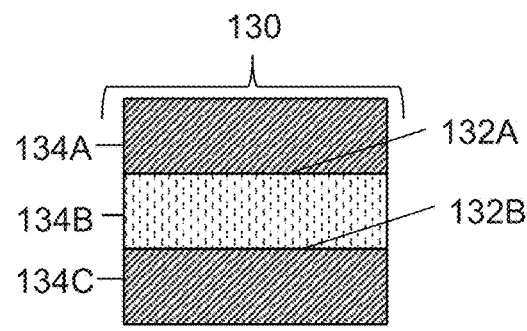
FIG. 4B illustrates an embodiment of a patterned-retarded barrier layer.
Figure 4C:
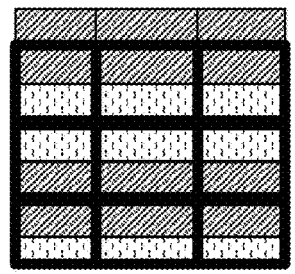
FIG. 4C illustrates an embodiment of a patterned-retarded barrier layer shifted and positioned adjacent to an embodiment of a layer of pixels from a top view.
Figure 4D:
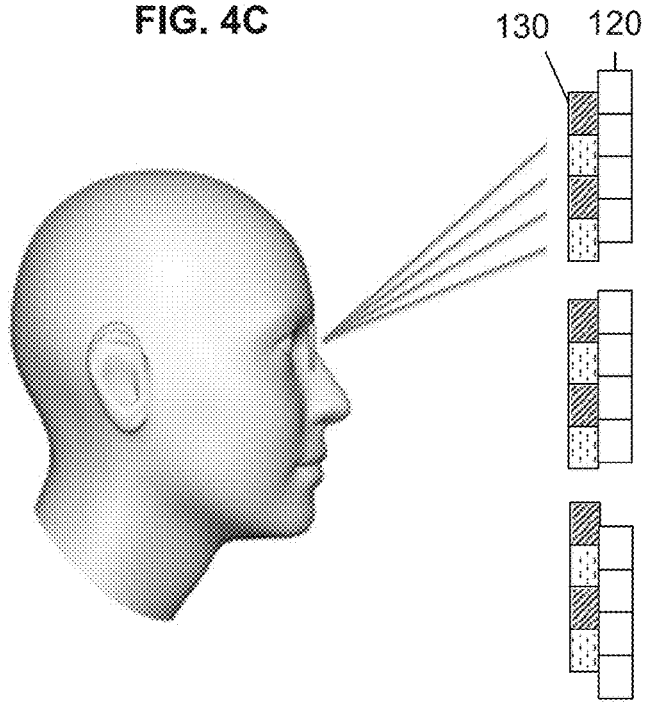
FIG. 4D illustrates user viewing an embodiment of a patterned-retarded barrier layer shifted adjacent to a layer of pixels from a side view.
Figure 4E:
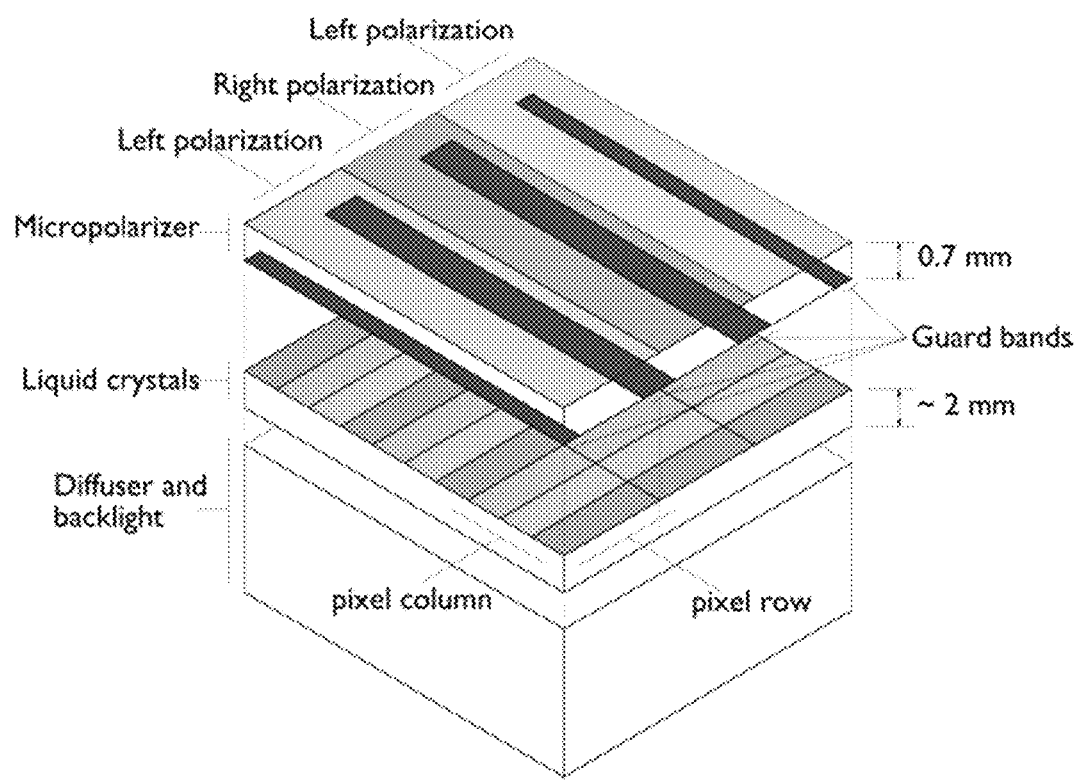
FIG. 4E illustrates another embodiment of a patterned-retarded barrier layer shifted adjacent to a layer of pixels from a perspective view.

A visualization element 102 may include first layer of pixels 120. Each pixel 122 includes an inner segment 124 defined by an outer border 126 as illustrated in FIG. 4A. The outer border 126 may take any shape, but in certain embodiments, is shaped as a polygon that has at least two generally parallel border edges 128A, 128B. Another layer of the visualization element 102 may include a patterned-retarded barrier 130 which has lines of polarization 132A, 132B that separate alternating segments of polarization 134A, 134B, 134C. More specifically, a first segment of polarization may be negative 134A, the directly adjacent segment of polarization 134B is positive, the next directly adjacent segment of polarization is negative 134C, and so on, continuing to alternate polarity with each line of polarization 132A, 132B as illustrated in FIG. 4B. The patterned-retarder barrier 130 may be positioned directly or indirectly adjacent to the layer of pixels such that the inner segment of each pixel is in contact with a portion of only one line of positive polarization 132A and only one line of negative polarization 132B. The inner segment of each pixel is also in contact with two polarization segments—a negative polarization segment 134A and a positive polarization segment 134B as illustrated in FIG. 4C and FIG. 4D. Such placement of the patterned retarded barrier is considered "shifted" relative to an alternate configuration in which each line of polarization is generally aligned with each pixel such that the inner segment of each pixel is generally in contact with only one type of polarization segment. FIG. 4E illustrates a similar embodiment that incorporates a micropolarizer element.

Figure 5A:
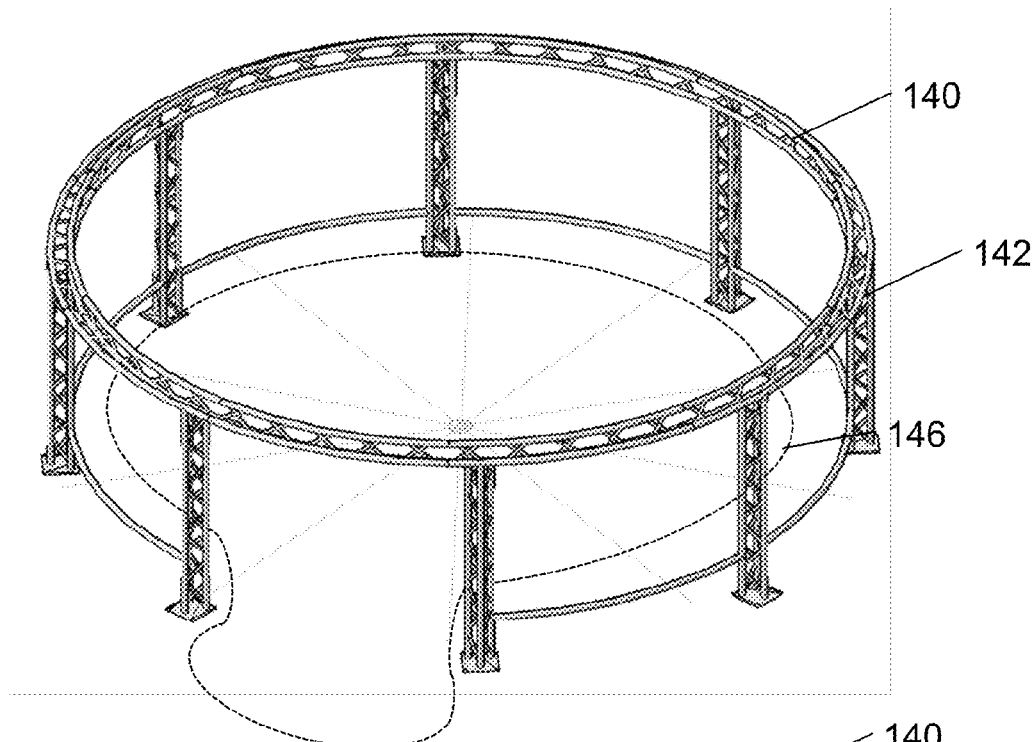
FIG. 5A illustrates an embodiment of a infrastructure element.
Figure 5B:
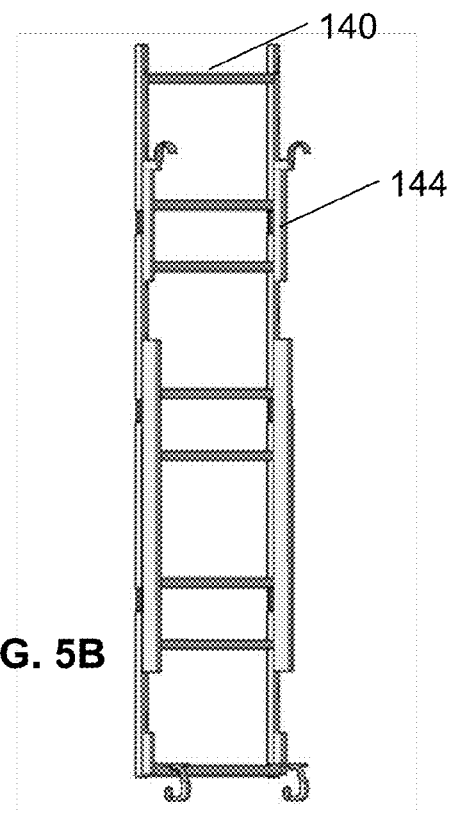
FIG. 5B illustrates another embodiment of a infrastructure element.

FIG. 5A illustrates an infrastructure element 140 configured as a truss structure embodiment 142. FIG. 5A also illustrates a possible intended viewing perimeter 146 for the illustrated embodiment. However, many other shapes of intended viewing perimeters are contemplated and may be configured specifically for a certain display geometry, user location, or for viewing a certain representation. FIG. 5B illustrates an infrastructure element 140 configured as a hanging display unit 144.

Figure 6:
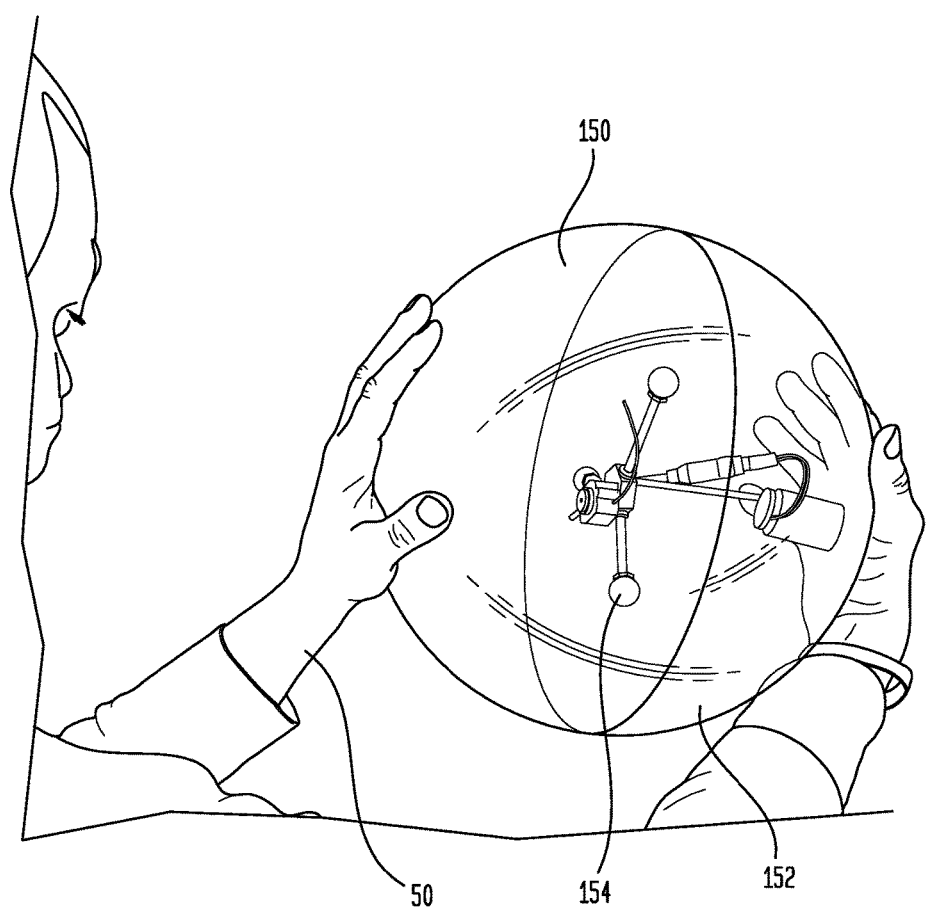
FIG. 6 illustrates an embodiment of a sphere navigation unit.

FIG. 6 illustrates an embodiment of a user 50 holding a user input component 108 configured as a sphere navigation unit 150. The illustrated sphere navigation unit 150 includes a housing 152 and a six-degree of freedom unit 154.

Figure 7:
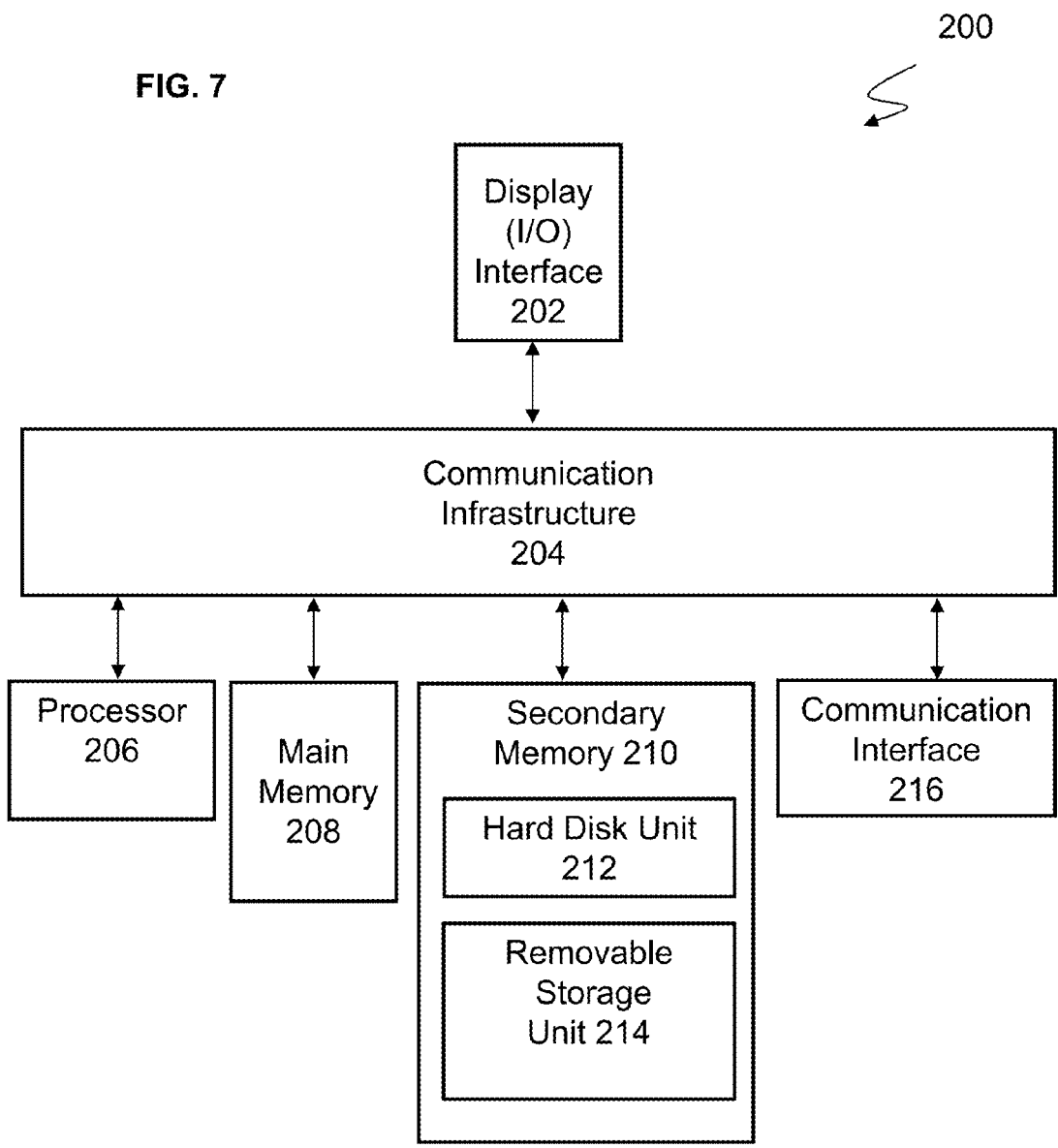
FIG. 7 illustrates an embodiment of a computer system.

FIG. 7 illustrates an exemplary computer system 200 that may be used to implement the methods according to the invention. One or more computer systems 200 may carry out the methods presented herein as computer code.

Computer system 200 includes an input/output display interface 202 connected to communication infrastructure 204—such as a bus—, which forwards data such as graphics, text, and information, from the communication infrastructure 204 or from a frame buffer (not shown) to other components of the computer system 200. The input/output display interface 202 may be, for example, a keyboard, touch screen, joystick, trackball, mouse, monitor, speaker, printer, any other computer peripheral device, or any combination thereof, capable of entering and/or viewing data.

Computer system 200 includes one or more processors 206, which may be a special purpose or a general-purpose digital signal processor that processes certain information. Computer system 200 also includes a main memory 208, for example random access memory ("RAM"), read-only memory ("ROM"), mass storage device, or any combination thereof. Computer system 200 may also include a secondary memory 210 such as a hard disk unit 212, a removable storage unit 214, or any combination thereof. Computer system 200 may also include a communication interface 216, for example, a modem, a network interface (such as an Ethernet card or Ethernet cable), a communication port, a PCMCIA slot and card, wired or wireless systems (such as Wi-Fi, Bluetooth, Infrared), local area networks, wide area networks, intranets, etc.

It is contemplated that the main memory 208, secondary memory 210, communication interface 216, or a combination thereof, function as a computer usable storage medium, otherwise referred to as a computer readable storage medium, to store and/or access computer software including computer instructions. For example, computer programs or other instructions may be loaded into the computer system 200 such as through a removable storage device, for example, a floppy disk, ZIP disks, magnetic tape, portable flash drive, optical disk such as a CD or DVD or Blu-ray, Micro-Electro-Mechanical Systems ("MEMS"), nanotechnological apparatus. Specifically, computer software including computer instructions may be transferred from the removable storage unit 214 or hard disc unit 212 to the secondary memory 210 or through the communication infrastructure 204 to the main memory 208 of the computer system 200.

Communication interface 216 allows software, instructions and data to be transferred between the computer system 200 and external devices or external networks. Software, instructions, and/or data transferred by the communication interface 216 are typically in the form of signals that may be electronic, electromagnetic, optical or other signals capable of being sent and received by the communication interface 216. Signals may be sent and received using wire or cable, fiber optics, a phone line, a cellular phone link, a Radio Frequency ("RF") link, wireless link, or other communication channels.

Computer programs, when executed, enable the computer system 200, particularly the processor 206, to implement the methods of the invention according to computer software including instructions.

The computer system 200 described herein may perform any one of, or any combination of, the steps of any of the methods presented herein. It is also contemplated that the methods according to the invention may be performed automatically, or may be invoked by some form of manual intervention.

The computer system 200 of FIG. 7 is provided only for purposes of illustration, such that the invention is not limited to this specific embodiment. It is appreciated that a person skilled in the relevant art knows how to program and implement the invention using any computer system.

The computer system 200 may be a handheld device and include any small-sized computer device including, for example, a personal digital assistant ("PDA"), smart handheld computing device, cellular telephone, or a laptop or netbook computer, hand held console or MP3 player, tablet, or similar hand held computer device, such as an iPad®, iPad Touch® or iPhone®.

Figure 8:
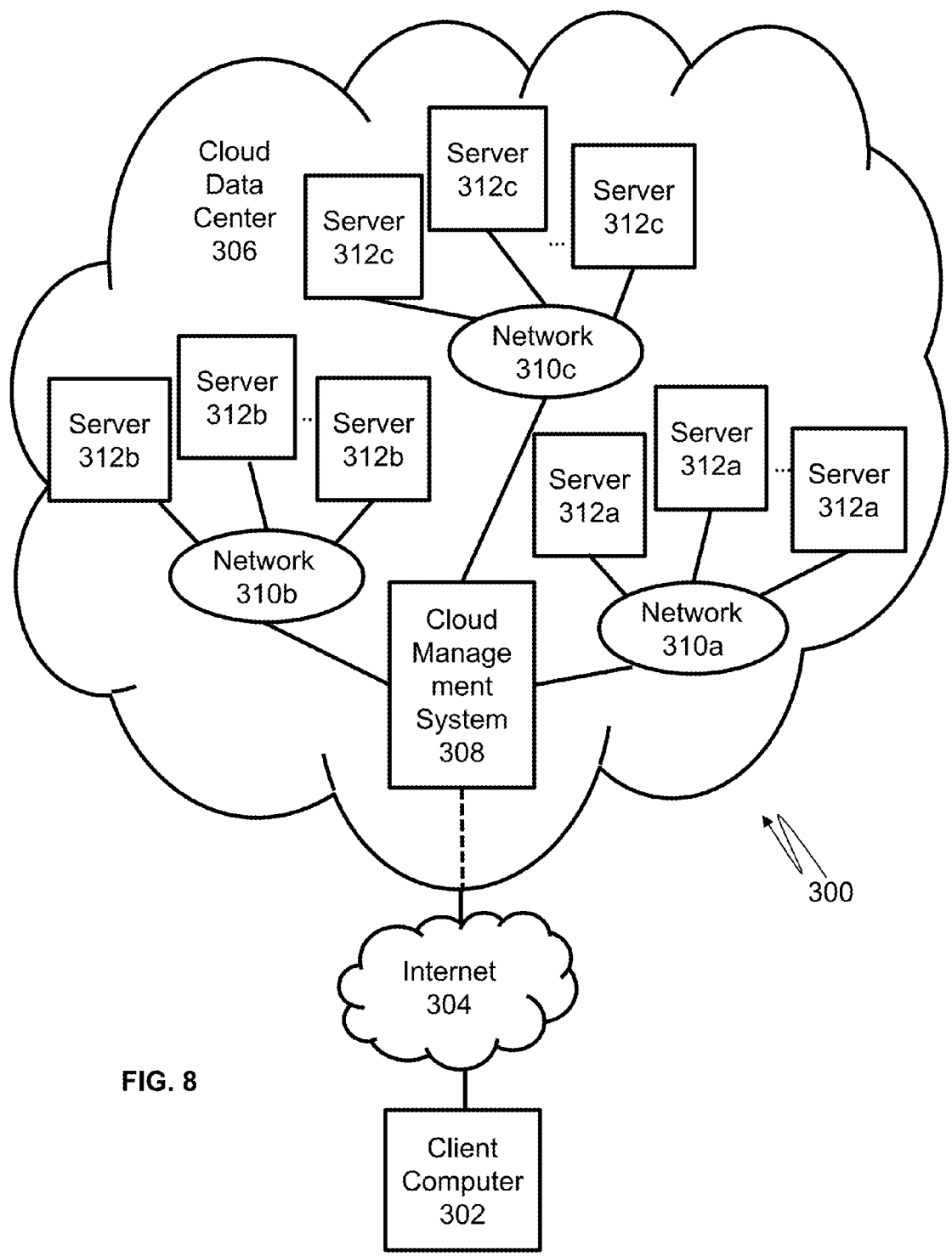
FIG. 8 illustrates an embodiment of a cloud computing system.

FIG. 8 illustrates an exemplary cloud computing system 300 that may be used to implement the methods according to the present invention. The cloud computing system 300 includes a plurality of interconnected computing environments. The cloud computing system 300 utilizes the resources from various networks as a collective virtual computer, where the services and applications can run independently from a particular computer or server configuration making hardware less important.

Specifically, the cloud computing system 300 includes at least one client computer 302. The client computer 302 may be any device through the use of which a distributed computing environment may be accessed to perform the methods disclosed herein, for example, a traditional computer, portable computer, mobile phone, personal digital assistant, tablet to name a few. The client computer 302 includes memory such as random access memory ("RAM"), read-only memory ("ROM"), mass storage device, or any combination thereof. The memory functions as a computer usable storage medium, otherwise referred to as a computer readable storage medium, to store and/or access computer software and/or instructions.

The client computer 302 also includes a communications interface, for example, a modem, a network interface (such as an Ethernet card), a communications port, a PCMCIA slot and card, wired or wireless systems, etc. The communications interface allows communication through transferred signals between the client computer 302 and external devices including networks such as the Internet 304 and cloud data center 306. Communication may be implemented using wireless or wired capability such as cable, fiber optics, a phone line, a cellular phone link, radio waves or other communication channels.

The client computer 302 establishes communication with the Internet 304—specifically to one or more servers—to, in turn, establish communication with one or more cloud data centers 306. A cloud data center 306 includes one or more networks 310a, 310b, 310c managed through a cloud management system 308. Each network 310a, 310b, 310c includes resource servers 312a, 312b, 312c, respectively. Servers 312a, 312b, 312c permit access to a collection of computing resources and components that can be invoked to instantiate a virtual machine, process, or other resource for a limited or defined duration. For example, one group of resource servers can host and serve an operating system or components thereof to deliver and instantiate a virtual machine. Another group of resource servers can accept requests to host computing cycles or processor time, to supply a defined level of processing power for a virtual machine. A further group of resource servers can host and serve applications to load on an instantiation of a virtual machine, such as an email client, a browser application, a messaging application, or other applications or software.

The cloud management system 308 can comprise a dedicated or centralized server and/or other software, hardware, and network tools to communicate with one or more networks 310a, 310b, 310c, such as the Internet or other public or private network, with all sets of resource servers 312a, 312b, 312c. The cloud management system 308 may be configured to query and identify the computing resources and components managed by the set of resource servers 312a, 312b, 312c needed and available for use in the cloud data center 306. Specifically, the cloud management system 308 may be configured to identify the hardware resources and components such as type and amount of processing power, type and amount of memory, type and amount of storage, type and amount of network bandwidth and the like, of the set of resource servers 312a, 312b, 312c needed and available for use in the cloud data center 306. Likewise, the cloud management system 308 can be configured to identify the software resources and components, such as type of Operating System ("OS"), application programs, and the like, of the set of resource servers 312a, 312b, 312c needed and available for use in the cloud data center 306.

The present invention is also directed to computer products, otherwise referred to as computer program products, to provide software to the cloud computing system 300. Computer products store software on any computer useable medium, known now or in the future. Such software, when executed, may implement the methods according to certain embodiments of the invention. Examples of computer useable mediums include, but are not limited to, primary storage devices (e.g., any type of random access memory), secondary storage devices (e.g., hard drives, floppy disks, CD ROMS, ZIP disks, tapes, magnetic storage devices, optical storage devices, Micro-Electro-Mechanical Systems ("MEMS"), nanotechnological storage device, etc.), and communication mediums (e.g., wired and wireless communications networks, local area networks, wide area networks, intranets, etc.). It is to be appreciated that the embodiments described herein may be implemented using software, hardware, firmware, or combinations thereof.

The cloud computing system 300 of FIG. 8 is provided only for purposes of illustration and does not limit the invention to this specific embodiment. It is appreciated that a person skilled in the relevant art knows how to program and implement the invention using any computer system or network architecture.

Figure 9A:
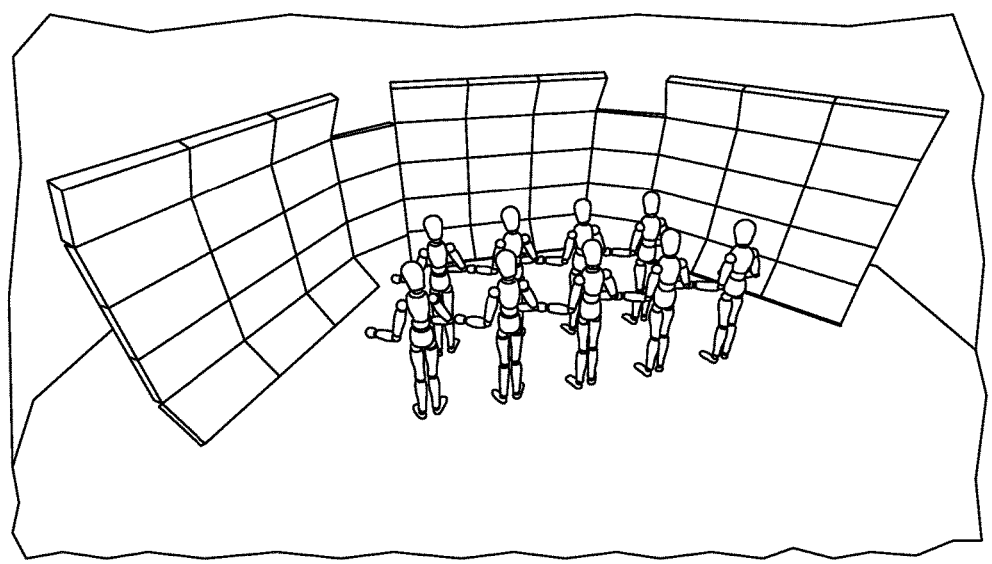
FIG. 9A illustrates an embodiment of the system 100 from a perspective view.
Figure 9B:
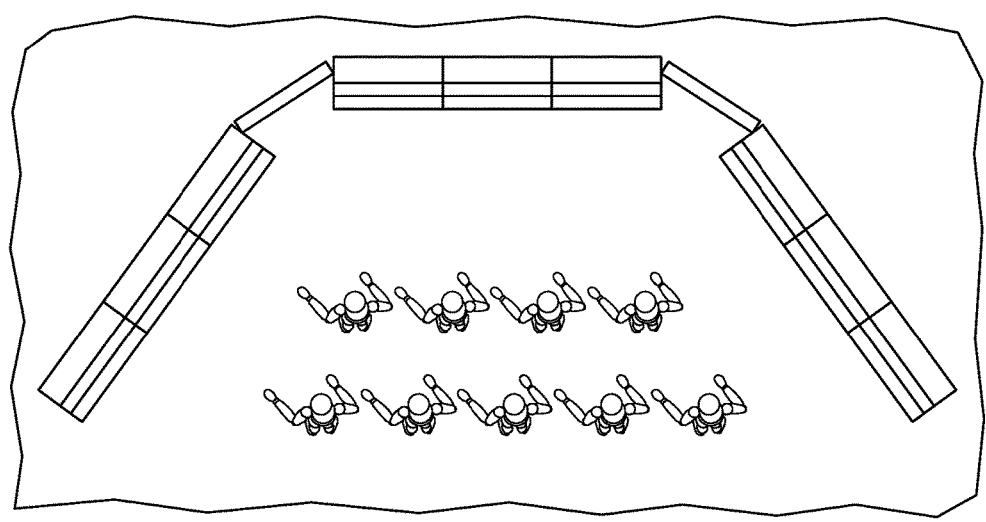
FIG. 9B illustrates the embodiment in FIG. 9A from a top view. The display geometry of the embodiment of a compound display component illustrated in FIG. 9A is termed three-emphasis, two bridge geometry.

FIG. 9A illustrates an embodiment of the system 100 from a perspective view. FIG. 9B illustrates the embodiment in FIG. 9A from a top view. The display geometry of the embodiment of a compound display component illustrated in FIG. 9A is termed three-emphasis, two bridge geometry.

Figure 10:
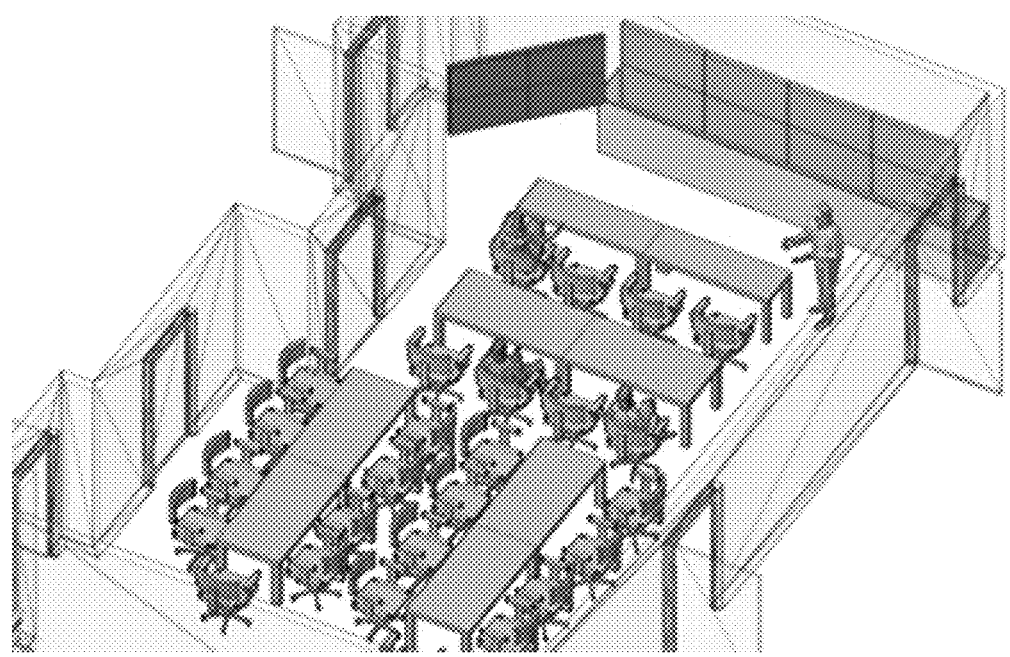
FIG. 10 illustrates an embodiment of the system 100 including a compound display component having a chalkboard display geometry and a billboard display geometry.

FIG. 10 illustrates an embodiment of the system 100 including a compound display component having a chalkboard display geometry and a billboard display geometry.

Figure 11A:
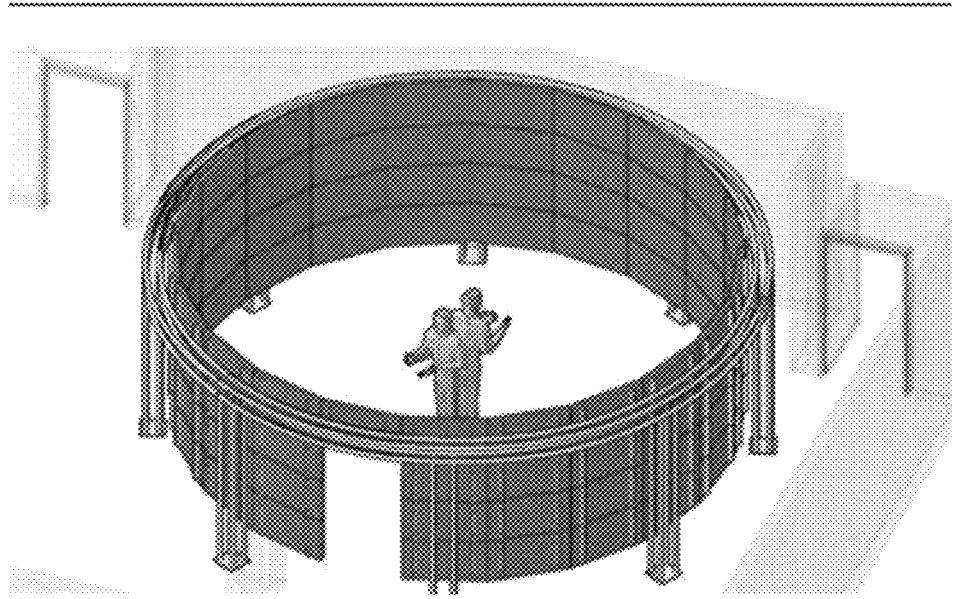
FIG. 11A illustrates an embodiment of the system 100 including a compound display component having a continuous circle with doorway display geometry.

FIG. 11A illustrates an embodiment of the system 100 including a compound display component having a continuous circle with doorway display geometry.

Figure 11B:
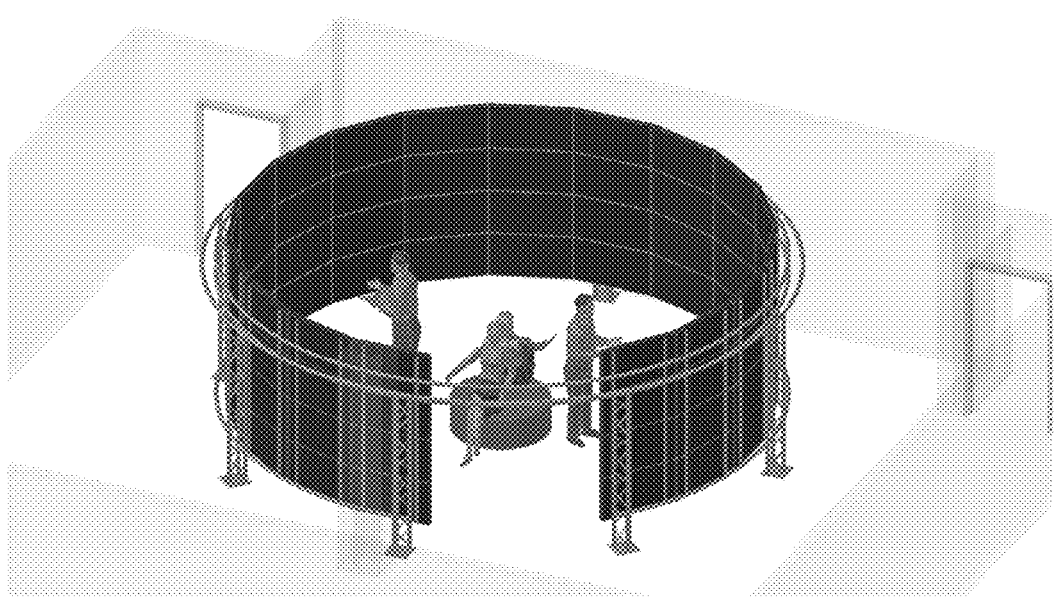
FIG. 11B illustrates an embodiment of the system 100 including a compound display component having an upright semi-circular display geometry.

FIG. 11B illustrates an embodiment of the system 100 including a compound display component having an upright semi-circular display geometry.

Figure 12:
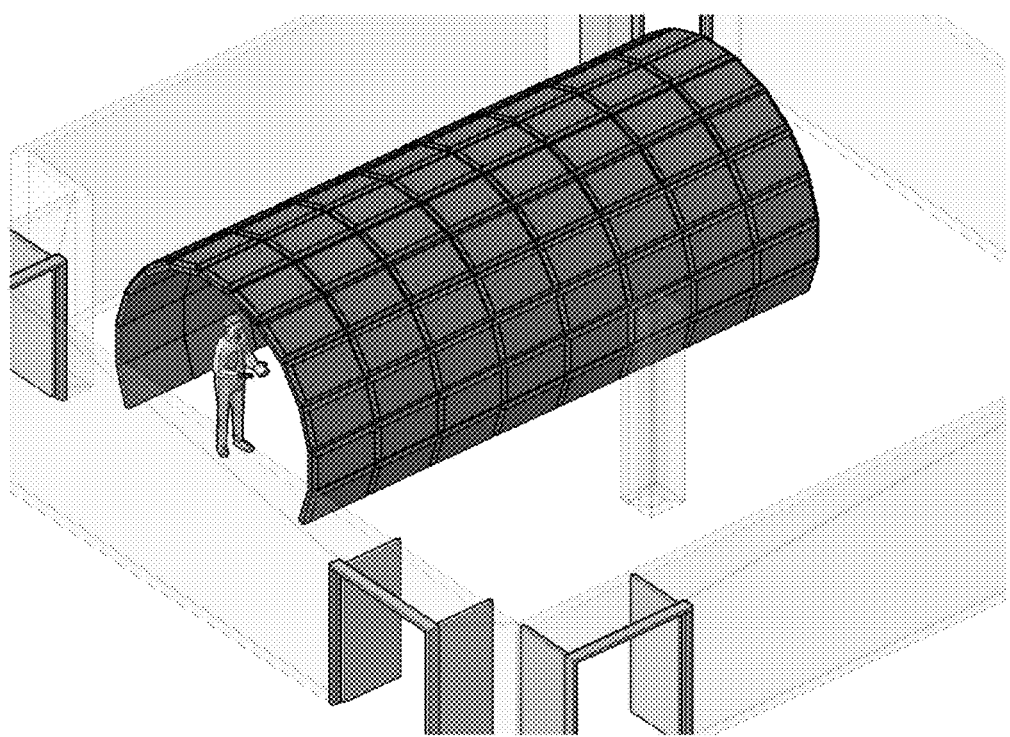
FIG. 12 illustrates an embodiment of the system 100 including a compound display component having an inverted semi-circle display geometry.

FIG. 12 illustrates an embodiment of the system 100 including a compound display component having an inverted semi-circle display geometry.

Figure 13A:
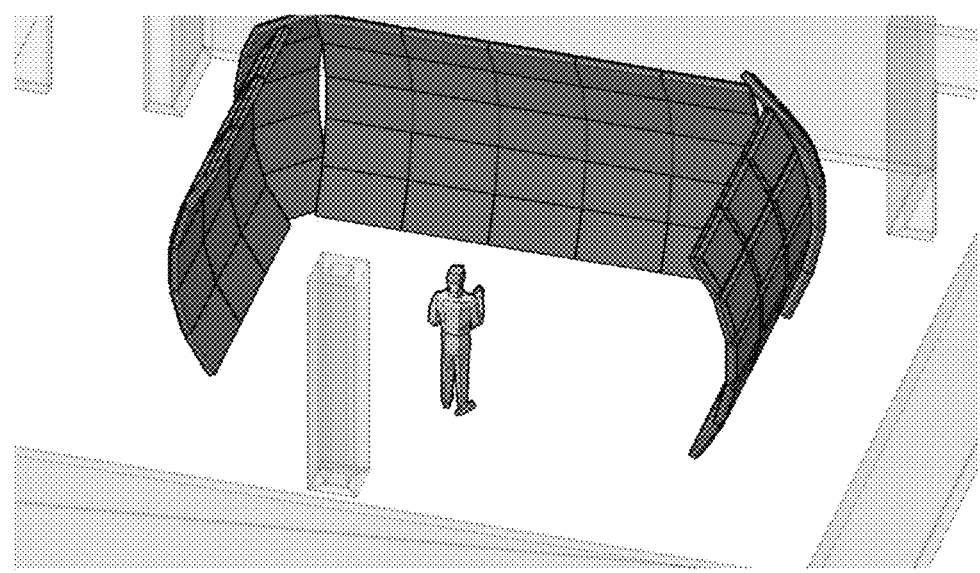
FIG. 13A and FIG. 13B illustrate an embodiment of the system 100 including a compound display component having a front-emphasized, two-side, two gap-filler display geometry.
Figure 13B:
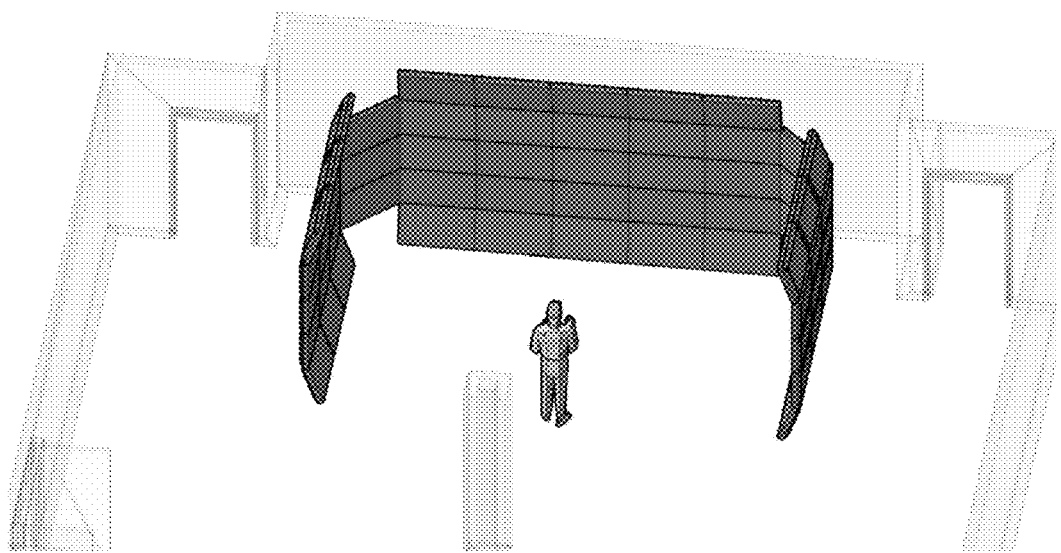

FIG. 13A and FIG. 13B illustrate an embodiment of the system 100 including a compound display component having a front-emphasized, two-side, two gap-filler display geometry.

Figure 14:
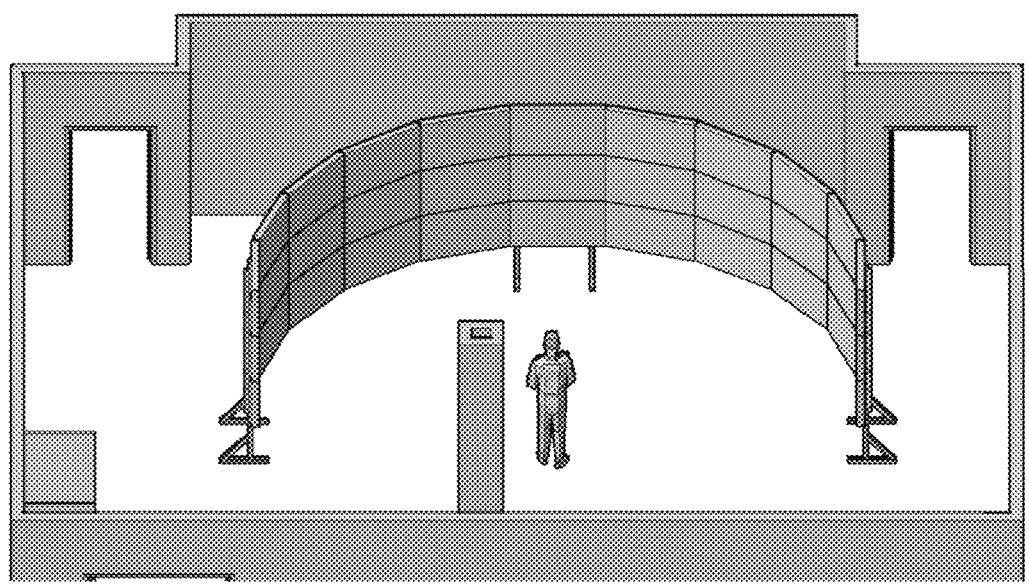
FIG. 14 illustrates an embodiment of the system 100 including a compound display component having an arced display geometry.

FIG. 14 illustrates an embodiment of the system 100 including a compound display component having an arced display geometry.

Figure 15:
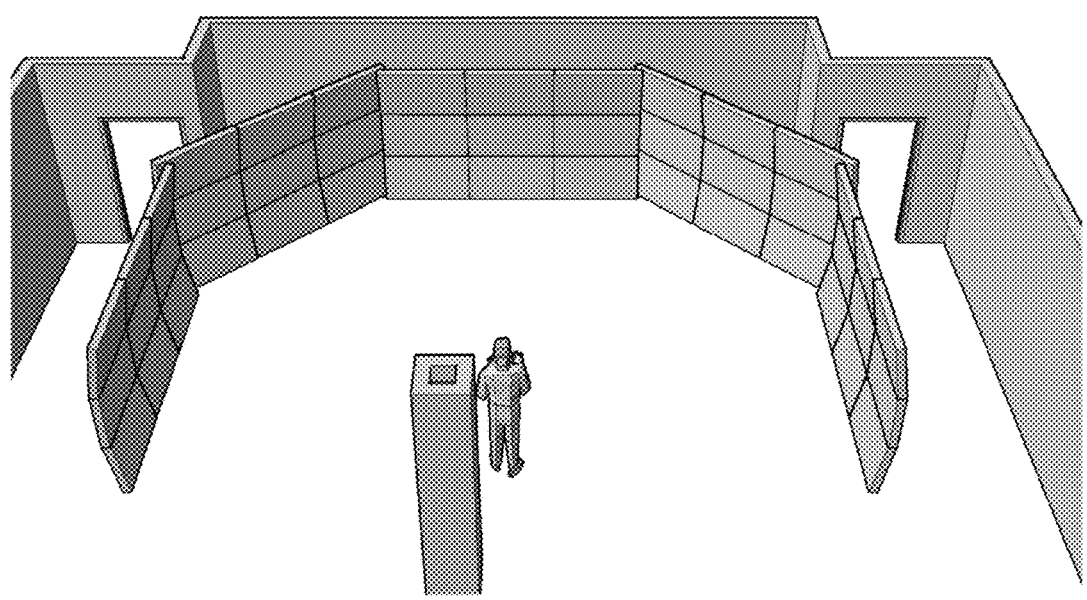
FIG. 15 illustrates an embodiment of the system 100 including a compound display component having a five-partition crescent display geometry.

FIG. 15 illustrates an embodiment of the system 100 including a compound display component having a five-partition crescent display geometry.

Figure 16:
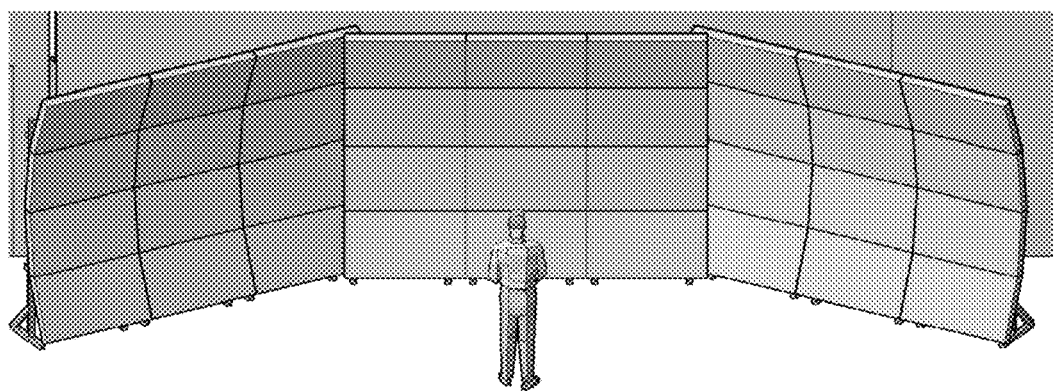
FIG. 16 illustrates an embodiment of the system 100 including a compound display component having a three-partition angled display geometry.

FIG. 16 illustrates an embodiment of the system 100 including a compound display component having a three-partition angled display geometry.

Figure 17:
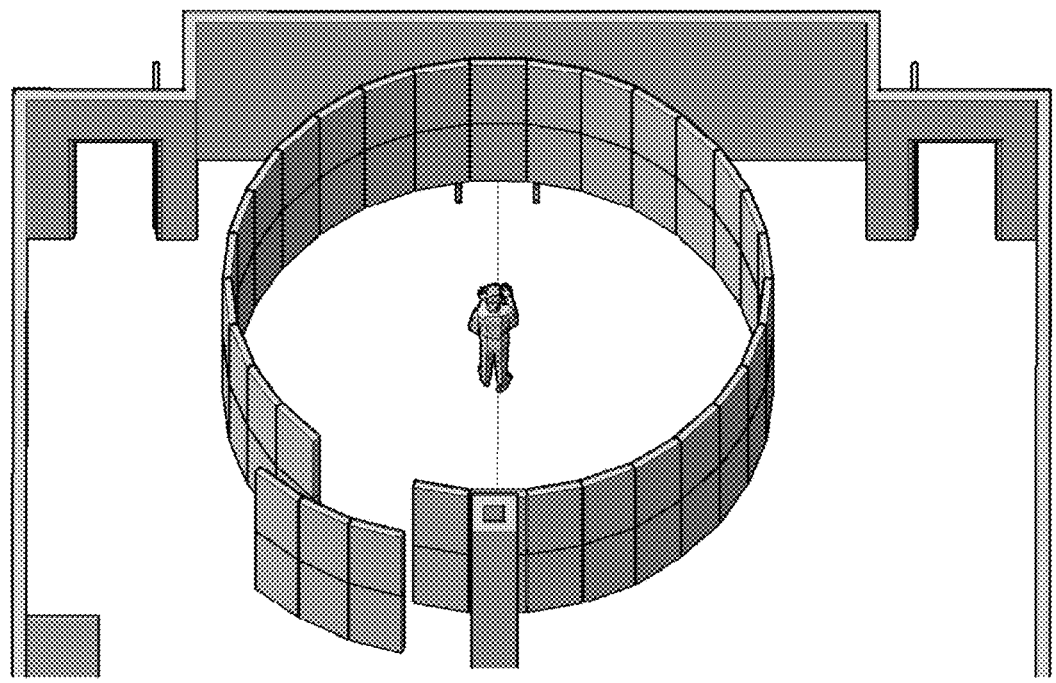
FIG. 17 illustrates an embodiment of the system 100 including a compound display component having a semi-circular and interval gap-filler display geometry.

FIG. 17 illustrates an embodiment of the system 100 including a compound display component having a semi-circular and interval gap-filler display geometry.

Figure 18:
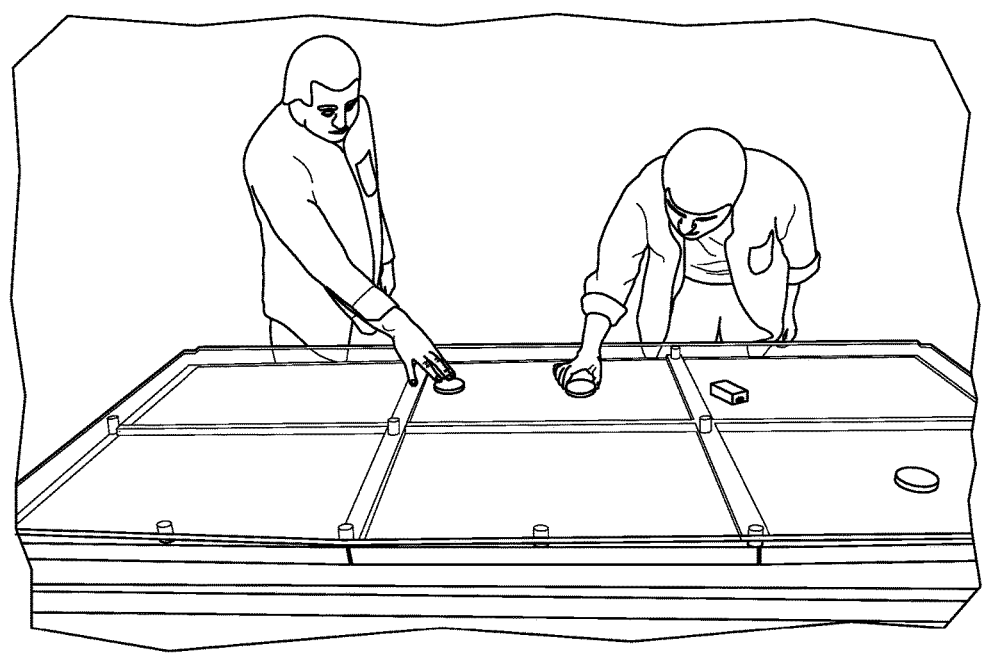
FIG. 18 illustrates an embodiment of the system 100 including a compound display component having a table display geometry.

FIG. 18 illustrates an embodiment of the system 100 including a compound display component having a table display geometry.

While the disclosure is susceptible to various modifications and alternative forms, specific exemplary embodiments of the present invention have been shown by way of example in the drawings and have been described in detail. It should be understood, however, that there is no intent to limit the disclosure to the particular embodiments disclosed, but on the contrary, the intention is to cover all modifications, equivalents, and alternatives falling within the scope of the disclosure as defined by the appended claims.

What is claimed is:

1. A system for facilitating visualization of information by one or more users, comprising: a plurality of display elements, each display element comprising a dual function screen, each dual function screen comprising: a layer of pixels, each pixel of the layer of pixels having an inner segment defined by an outer border comprising at least two parallel border edges; and a patterned-retarder barrier comprising a plurality of parallel lines of polarization, the plurality of parallel lines of polarization comprising a plurality of positive lines of polarization sequentially alternating or interleaved line-by-line with a plurality of negative lines of polarization to form a plurality of interleaved lines of positive and negative polarization; wherein a first display element of the plurality of display elements comprises a first dual function screen comprising a first layer of pixels and a first patterned-retarder barrier arranged adjacent the first layer of pixels and shifted in a first direction providing that the inner segment of each pixel of the first layer of pixels is in contact both with a portion of only one line of positive polarization and with a portion of only one line of negative polarization; and wherein a second display element of the plurality of display elements is arranged to be co-planar with the first display element, the second display element comprising a second dual function screen arranged to be coplanar with the first dual function screen, the second dual function screen comprising a second layer of pixels and a second patterned-retarder barrier arranged adjacent the second layer of pixels and shifted in a second direction, the second direction different from and opposite to the first direction, providing that the inner segment of each pixel of the second layer of pixels is in contact both with a portion of only one line of negative polarization and with a portion of only one line of positive polarization wherein a third display element of the plurality of display elements is arranged to be coplanar with and in between the first and second display elements, the third display element comprising a third dual function screen arranged to be co-planar with and in between the first and second dual function screens, the third dual function screen comprising a third layer of pixels and a third patterned retarder barrier arranged adjacent the third layer of pixels without shifting to provide that the inner segment of each pixel of the third layer of pixels is in contact exclusively with either only one line of positive polarity or only one line of negative polarization.

2. The system of claim 1, wherein each dual function screen is substantially flat and configured to provide a hybrid viewing experience for simultaneously perceiving two-dimensional images and three-dimensional images.

3. The system of claim 1, further comprising: an infrastructure component coupled to the plurality of display elements to position one or more of the plurality of display elements in a selected display geometry.

4. The system of claim 3, wherein the selected display geometry is selected from the group consisting of: a wall surface, a table surface, a floor surface, an upright semi-circle, an inverted semi-circle, and combinations thereof.

5. The system of claim 1, wherein each of the first, second and third display elements form a generally continuous and substantially flat compound screen.

6. The system of claim 1, further comprising: a processor; a memory; and an audio component comprising a plurality of audio speakers.

7. The system of claim 1, further comprising: a user sensor adapted to detect a position of one or more users relative to the plurality of audio speakers or to the plurality of display elements.

8. The system of claim 1, further comprising: a user input element selected from the group consisting of: a gaming controller, a joy stick, a wheel controller component, a keyboard, a mouse, a six-degree of freedom unit, a speech recognition component, a gesture recognition receiver, and combinations thereof.

9. The system of claim 8, wherein the user input element is configured as a navigation unit.

10. The system of claim 1, wherein the first display element is arranged to be in an upper part of the visual field of the one or more persons, the second display element is arranged to be in a lower part of the visual field of the one or more persons, and the third display element is arranged to be in a middle part in between the upper and lower parts of the visual field of the one or more persons; or wherein the first display element is arranged to be in a left part of the visual field of the one or more persons, the second display element is arranged to be in a right part of the visual field of the one or more persons, and the third display element is arranged to be in the middle part in between the upper and lower parts of the visual field of the one or more persons.

11. The system of claim 1, wherein the first display element, the second display element, and the third display element are arranged to be coplanar vertically and the first and second directions are vertical; or wherein the first display element, the second display element, and the third display element are arranged to be coplanar horizontally and the first and second direction are horizontal.

12. The system of claim 1, wherein the first and second directions are both in the vertical dimension or both in the horizontal dimension.

13. The system of claim 1, wherein a fourth display element of the plurality of display elements is arranged to be coplanar with the first, second and third display elements and adjacent the third display element on a first lateral side, the fourth display element comprising a fourth dual function screen arranged to be co-planar with and adjacent the third dual function screen, the fourth dual function screen comprising a fourth layer of pixels and a fourth patterned-retarder barrier arranged adjacent the fourth layer of pixels and shifted in a third direction, the third direction different from and orthogonal to the first and second directions, providing that the inner segment of each pixel of the fourth layer of pixels is in contact both with a portion of only one line of negative polarization and with a portion of only one line of positive polarization.

14. The system of claim 13, wherein a fifth display element of the plurality of display elements is arranged to be coplanar with the first, second, third and fourth display elements and adjacent the third display element on a second lateral side opposite the first lateral side, the fifth display element comprising a fifth dual function screen arranged to be co-planar with and adjacent the third dual function screen, the fifth dual function screen comprising a fifth layer of pixels and a fifth patterned-retarder barrier arranged adjacent the fifth layer of pixels and shifted in a fourth direction, the fourth direction different from the first, second and third directions, orthogonal to the first and second directions and opposite the third direction, providing that the inner segment of each pixel of the fourth layer of pixels is in contact both with a portion of only one line of positive polarization and with a portion of only one line of negative polarization.

15. The system of claim 14, further comprising: an infrastructure component coupled to the plurality of display elements to position one or more of the plurality of display elements in a substantially flat display geometry, wherein the substantially flat display geometry is selected from the group consisting of: a wall surface, a table surface, a floor surface, and combinations thereof.

16. The system of claim 14, wherein the first and second directions are both at least partially in the vertical dimension and the third and fourth directions are both at least partially in the horizontal dimension, or wherein the first and second directions are both at least partially in the horizontal dimension and the third and fourth directions are both at least partially in the vertical dimension, or wherein the first and second directions are both at least partially in the north-south direction and the third and fourth directions are both at least partially in the east-west dimension.

17. The system of claim 14, wherein the first display element is arranged to be in the upper part of the visual field of the one or more persons, the second display element is arranged to be in the lower part of the visual field of the one or more persons, the third display element is arranged to be in the middle part in between the upper and lower parts of the visual field of the one or more persons, the fourth display element is arranged to be in the right part of the visual field of the one or more persons, and the fifth display element is arranged to be in the left part of the visual field of the one or more persons.

18. A system for facilitating visualization of information by one or more users, comprising: a plurality of co-planar display elements, each co-planar display element comprising a substantially flat dual function screen configured to provide a hybrid viewing experience for simultaneously perceiving two-dimensional images and three-dimensional images, each dual function screen comprising: a layer of pixels, each pixel of the layer of pixels having an inner segment defined by an outer border comprising at least two parallel border edges; and a patterned-retarder barrier comprising a plurality of parallel lines of polarization, the plurality of parallel lines of polarization comprising a plurality of positive lines of polarization sequentially alternating or interleaved line-by-line with a plurality of negative lines of polarization to form a plurality of interleaved lines of positive and negative polarization; wherein a first co-planar display element of the plurality of co-planar display elements comprises a first dual function screen comprising a first layer of pixels and a first patterned-retarder barrier arranged adjacent the first layer of pixels and shifted in a first direction providing that the inner segment of each pixel of the first layer of pixels is in contact both with a portion of only one line of positive polarization and with a portion of only one line of negative polarization; wherein a second co-planar display element of the plurality of co-planar display elements comprises a second dual function screen, the second dual function screen comprising a second layer of pixels and a second patterned-retarder barrier arranged adjacent the second layer of pixels and shifted in a second direction, the second direction different from and opposite to the first direction, providing that the inner segment of each pixel of the second layer of pixels is in contact both with a portion of only one line of negative polarization and with a portion of only one line of positive polarization; wherein a third co-planar display element of the plurality of co-planar display elements is arranged in between the first and second display elements, the third display element comprising a third dual function screen, the third dual function screen comprising a third layer of pixels and a third patterned-retarder barrier arranged adjacent the third layer of pixels without shifting to provide that the inner segment of each pixel of the third layer of pixels is in contact exclusively with either only one line of positive polarity or only one line of negative polarization; and an infrastructure component coupled to the plurality of co-planar display elements to position the plurality of co-planar display elements to form a generally continuous compound screen having a selected display geometry, the selected display geometry selected from the group consisting of: a wall surface, a table surface, a floor surface, an upright semi-circle, an inverted semi-circle, and combinations thereof.

19. A system for facilitating visualization of information by one or more users, comprising: a plurality of co-planar display elements, each co-planar display element comprising a substantially flat dual function screen, each dual function screen comprising: a layer of pixels, each pixel of the layer of pixels having an inner segment defined by an outer border comprising at least two parallel border edges; and a patterned-retarder barrier comprising a plurality of parallel lines of polarization, the plurality of parallel lines of polarization comprising a plurality of positive lines of polarization sequentially alternating or interleaved line-by-line with a plurality of negative lines of polarization to form a plurality of interleaved lines of positive and negative polarization; wherein a first co-planar display element of the plurality of co-planar display elements comprises a first dual function screen comprising a first layer of pixels and a first patterned-retarder barrier arranged adjacent the first layer of pixels and shifted in a first direction providing that the inner segment of each pixel of the first layer of pixels is in contact both with a portion of only one line of positive polarization and with a portion of only one line of negative polarization; wherein a second co-planar display element of the plurality of co-planar display elements comprises a second dual function screen, the second dual function screen comprising a second layer of pixels and a second patterned-retarder barrier arranged adjacent the second layer of pixels and shifted in a second direction, the second direction different from and opposite to the first direction, providing that the inner segment of each pixel of the second layer of pixels is in contact both with a portion of only one line of negative polarization and with a portion of only one line of positive polarization; wherein a third co-planar display element of the plurality of co-planar display elements is arranged in between the first and second display elements, the third display element comprising a third dual function screen, the third dual function screen comprising a third layer of pixels and a third patterned-retarder barrier arranged adjacent the third layer of pixels without shifting to provide that the inner segment of each pixel of the third layer of pixels is in contact exclusively with either only one line of positive polarity or only one line of negative polarization; wherein a fourth co-planar display element of the plurality of co-planar display elements is arranged adjacent the third display element on a first lateral side, the fourth display element comprising a fourth dual function, the fourth dual function screen comprising a fourth layer of pixels and a fourth patterned-retarder barrier arranged adjacent the fourth layer of pixels and shifted in a third direction, the third direction different from and orthogonal to the first and second directions, providing that the inner segment of each pixel of the fourth layer of pixels is in contact both with a portion of only one line of negative polarization and with a portion of only one line of positive polarization; wherein a fifth co-planar display element of the plurality of co-planar display elements is arranged adjacent the third display element on a second lateral side opposite the first lateral side, the fifth display element comprising a fifth dual function screen, the fifth dual function screen comprising a fifth layer of pixels and a fifth patterned-retarder barrier arranged adjacent the fifth layer of pixels and shifted in a fourth direction, the fourth direction different from the first, second and third directions, orthogonal to the first and second directions and opposite the third direction, providing that the inner segment of each pixel of the fourth layer of pixels is in contact both with a portion of only one line of positive polarization and with a portion of only one line of negative polarization; and an infrastructure component coupled to the plurality of co-planar display elements to position the plurality of co-planar display elements to form a substantially flat and generally continuous compound screen having a selected display geometry, the selected display geometry selected from the group consisting of: a wall surface, a table surface, a floor surface, and combinations thereof.

\* \* \* \* \*